US010678715B2

(12) United States Patent
Perry

(10) Patent No.: US 10,678,715 B2
(45) Date of Patent: *Jun. 9, 2020

(54) HYBRID ARCHITECTURE FOR SIGNAL PROCESSING AND SIGNAL PROCESSING ACCELERATOR

(71) Applicant: Altera Corporation, San Jose, CA (US)

(72) Inventor: Steven Perry, High Wycombe (GB)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/169,995

(22) Filed: Oct. 24, 2018

(65) Prior Publication Data

US 2019/0171591 A1 Jun. 6, 2019

Related U.S. Application Data

(63) Continuation of application No. 14/686,326, filed on Apr. 14, 2015, now Pat. No. 10,268,605.

(Continued)

(51) Int. Cl.
*G06F 13/16* (2006.01)
*H03K 19/17728* (2020.01)
*H03K 19/17748* (2020.01)
*H03K 19/17736* (2020.01)
*G06F 30/34* (2020.01)
*G06F 30/327* (2020.01)

(Continued)

(52) U.S. Cl.
CPC ...... *G06F 13/1668* (2013.01); *G06F 13/4234* (2013.01); *G06F 30/327* (2020.01); *G06F 30/34* (2020.01); *H03K 19/1776* (2013.01);

*H03K 19/17728* (2013.01); *H03K 19/17736* (2013.01); *H03K 19/17748* (2013.01)

(58) Field of Classification Search
CPC ............ G06F 13/1668; G06F 13/4234; G06F 17/505; G06F 17/5054; H03K 19/17728; H03K 19/17736; H03K 19/17748; H03K 19/1776

See application file for complete search history.

(56) References Cited

U.S. PATENT DOCUMENTS 5,465,361 A 11/1995 Hoenninger, III
5,541,862 A 7/1996 Bright et al.
(Continued)

FOREIGN PATENT DOCUMENTS

JP 2013533466 A 8/2013

OTHER PUBLICATIONS

International Search Report and Written Opinion dated Dec. 19, 2014 in International Application No. PCT/US2014/056803.

*Primary Examiner* — Henry Tsai
*Assistant Examiner* — John B Roche
(74) *Attorney, Agent, or Firm* — Fletcher Yoder P.C.

(57) ABSTRACT

Systems and methods for configuring a SPA are disclosed. The SPA comprises a plurality of input ports, a plurality of data memory units, signal processing circuitry, and an enable block including at least two counters. Each counter determines an amount of unprocessed data that is stored in a respective one of the plurality of data memory units, and the enable block is configured to disable the signal processing circuitry until a predetermined amount of data is received over the input ports.

36 Claims, 14 Drawing Sheets

Related U.S. Application Data

(60) Provisional application No. 61/986,450, filed on Apr. 30, 2014.

(51) Int. Cl.
*H03K 19/1776* (2020.01)
*G06F 13/42* (2006.01)

(56) References Cited

U.S. PATENT DOCUMENTS

| | | |
|---|---|---|
| 5,808,655 A | 9/1998 | Haas et al. |
| 6,288,569 B1 | 9/2001 | Wittig et al. |
| 7,224,721 B2 | 5/2007 | Betz et al. |
| 8,369,177 B2 | 2/2013 | Hold et al. |
| 9,553,591 B2 * | 1/2017 | Perry ..................... G06F 1/02 |
| 2002/0078114 A1 | 6/2002 | Wang et al. |
| 2006/0072624 A1 | 4/2006 | Akita et al. |
| 2007/0038843 A1 | 2/2007 | Trivedi et al. |
| 2007/0043479 A1 | 2/2007 | Heiland et al. |
| 2010/0095286 A1 | 4/2010 | Kaplan |
| 2011/0264888 A1 | 10/2011 | Dasd et al. |
| 2012/0159101 A1 | 6/2012 | Miyoshi |
| 2012/0207298 A1 | 8/2012 | Meyer |
| 2013/0070789 A1 | 3/2013 | Hara et al. |
| 2013/0151458 A1 | 6/2013 | Indeck et al. |
| 2014/0126393 A1 | 5/2014 | Kirshnan et al. |

\* cited by examiner

800

| WORD 2 | | | | WORD 1 | | | | WORD 0 | | | | | | | |
|---|---|---|---|---|---|---|---|---|---|---|---|---|---|---|---|

Bits: 53 50 49 48 44 43 39 38 33 32 27 26 21 20 16 15 14 13 12 11 10 9 8 7 6 5 0

| REPEAT(4) | WT | NEXT_1(5) | NEXT_0(5) | ARINC(6) | BRINC(6) | CRINC(6) | DRINC(5) | B | W | AOUT | BOUT | I | DOUT | D | OPCODE(6) |

OPCODE:
- 0 NOP
- 1 MUL
- 2 MAC
- 3 AMUL
- 4 AMAC
- 5 SMUL
- 6 SMAC
- 7 CMUL
- 8 CMAC
- 9 CCMUL COMPLEX CONJUGATE MULT
- 10 CCMAC
- 11 MUL2
- 12 MAC2
- 13 POLY1
- 14 POLY2
- 15 MULW
- 16 MACW
- 17 CMPEQ
- 18 CMPNE
- 19 MAG
- 20 MAGMAC
- 21 AMULR
- 22 SMULR
- 23 INTERP

D:
- 0 NO DMEM IN TO ACCUMULATOR
- 1 DMEM IN TO ACCUMULATOR

DOUT:
- 0 DOUT IS UNUSED (V=0)
- 1 DOUT IS ACCUMULATOR
- 2 DOUT IS DMEM READ
- 3 DOUT IS SHIFTER

I:
- 0 NO CHAIN INPUT INTO ACCUMULATOR
- 1 CHAIN INPUT INTO ACCUMULATOR

BOUT:
- 0 BOUT IS UNUSED (V=0)
- 1 BOUT IS BMEM
- 2 BOUT IS ROUNDED ACCUMULATOR/DMEM
- 3 BOUT IS DELAYED BIN

AOUT:
- 0 AOUT IS UNUSED (V=0)
- 1 AOUT IS AMEM
- 2 AOUT IS ROUNDED ACCUMULATOR/DMEM
- 3 AOUT IS DELAYED AIN

W:
- 0 NO WRITE TO DMEM
- 1 WRITE_ACC_IN TO DMEM

B:
- 0 BWRITE FROM EXTERNAL INPUT
- 1 BWRITE FROM AREAD (MUL2/MAC2 MODES)

DRINC: INCREMENT TO D-READ ADDR REG
CRINC: INCREMENT TO C-READ ADDR REG
BRINC: INCREMENT TO B-READ ADDR REG
ARINC: INCREMENT TO A-READ ADDR REG

1302 CONFIGURE AN ARRAY OF SIGNAL PROCESSING ACCELERATORS (SPAS), WHICH IS SEPARATE FROM A FIELD PROGRAMMABLE GATE ARRAY (FPGA), TO RECEIVE INPUT DATA FROM THE FPGA

1304 CONFIGURE AN ARRAY OF NETWORK NODES TO CONTROLLABLY ROUTE THE INPUT SIGNALS TO THE ARRAY OF SPAS

HYBRID ARCHITECTURE FOR SIGNAL PROCESSING AND SIGNAL PROCESSING ACCELERATOR

This is a continuation of U.S. patent application Ser. No. 14/686,326, filed Apr. 14, 2015, and entitled "Hybrid Architecture for Signal Processing and Signal Processing Accelerator", which claims the benefit of U.S. Provisional Application No. 61/986,450, filed Apr. 30, 2014, and entitled "Hybrid Architecture for Signal Processing (HASP): Signal Processing Accelerator (SPA)", the disclosure of which is incorporated herein by reference in its entirety.

Generally, programmable logic devices (PLDs) such as field programmable gate arrays (FPGAs), include thousands of programmable logic cells that perform logic operations. For example, each such logic element ("LE") may include a look-up table ("LUT"), a register, and a small amount of other circuitry. The LUT may be programmable to produce an output signal that is any logical combination or function of the inputs to the LUT. The LE may be programmable with respect to whether and how the register is used, and what control signals (e.g., clock, clock enable, clear, etc.) are selected for application to the register. In addition to the LEs, an FPGA typically includes programmable interconnection circuitry for conveying signals to, from, and/or between the LEs in any of many different ways. This allows the relatively simple logic capabilities of individual LEs to be concatenated to perform logic tasks of considerable complexity.

It has become increasingly standard in FPGA architectures to add dedicated or "hard" blocks to programmable logic to add common functionality to the FPGA. These functional blocks incorporate specialized logic devices adapted to specific logic operations, such as serializers, deserializers, filters, adders, multiply and accumulate (MAC) circuits, and phase-locked loops (PLL). The logic cells and functional blocks are interconnected by a configurable interconnect network. The configurable interconnect network selectively routes connections between and among the logic cells and functional blocks. By configuring the combination of logic cells, functional blocks, and the interconnect network, a programmable device can be adapted to perform virtually any type of information processing function. Specialized blocks that are added to an FPGA may decrease the size of a function or to improve performance of a speed-critical block. A further attraction of specialized blocks is that the fixed implementation provides the benefit of a consistent implementation, reducing the effort of timing closure.

One of the main properties of specialized blocks is that they tend to provide dramatic benefits when used. However, it is rare that all the specialized blocks are used and sometimes specialized blocks are not used at all. Some of the major hurdles in adding specialized blocks to FPGAs are that 1) specialized blocks are a great advantage for some users, but may sometimes be wasted area for other users, and 2) it is not cost-efficient to make a family of FPGAs with too many different members and variations, and often it is not known until long after the device is defined which specialized blocks should be included in a design.

SUMMARY OF THE DISCLOSURE

This disclosure relates to integrated circuit devices, and particularly to such devices having a hybrid architecture for signal processing.

In accordance with implementations of the present invention, systems and methods for configuring circuitry for use with a field programmable gate array (FPGA) are disclosed. The circuitry includes an array of signal processing accelerators (SPAs) and an array of network nodes. The array of SPAs is separate from a field programmable gate array (FPGA), and the array of SPAs is configured to receive input signals from the FPGA. The array of network nodes controllably route the input signals to the array of SPAs.

In some implementations, the input signals comprise a data word and a control word that are transmitted over a same wire between at least one of the network nodes and at least one of the SPAs. The data word and the control word may each include a mode bit indicative of whether the input signal corresponds to a transfer of data or a control write. The data word and the control word may each include a valid bit representative of a write enable signal for the at least one of the SPAs. In some implementations, the control word includes at least one context bit indicative of whether to update a first set of coefficients with a second set of coefficients.

In some implementations, each SPA in the array of SPAs has a corresponding input network node in the array of network nodes that provides at least one input to the respective SPA. Each SPA in the array of SPAs may have a corresponding output network node in the array of network nodes that receives at least one output from the respective SPA. The array of SPAs may form a linear chain of SPAs that includes a set of direct connections between pairs of SPAs in the array of SPAs. In some implementations, the array of network nodes forms a two-dimensional grid, a set of horizontal direct connections connect pairs of adjacent network nodes that share a row in the two-dimensional grid, and a set of vertical direct connections connect pairs of adjacent network nodes that share a column in the two-dimensional grid.

In some implementations, the circuitry further comprises a hard processor subsystem that provides programming instructions to the array of SPAs, and an array of direct memory access blocks that interfaces between the hard processor subsystem and the array of SPAs. At least a first SPA and a second SPA in the array of SPAs may be connected such that an output signal of the first SPA is directly transmitted to an operator within the second SPA, and the first SPA and the second SPA implement a unary function. In some implementations, a first plurality of SPAs in the array of SPAs are master SPAs, a second plurality of SPAs in the array of SPAs are slave SPAs, and each slave SPA receives an input signal from a corresponding master SPA in the first plurality of SPAs.

In accordance with implementations of the present invention, systems and methods for configuring a SPA are disclosed. The SPA comprises a plurality of input ports, a plurality of data memory units, signal processing circuitry, and an enable block including at least two counters. Each counter determines an amount of unprocessed data that is stored in a respective one of the plurality of data memory units, and the enable block is configured to disable the signal processing circuitry until a predetermined amount of data is received over the input ports.

In some implementations, each counter determines the amount of unprocessed data by computing a difference between a read marker address and a write marker address within the respective one of the plurality of data memory units. The enable block may determine that the predetermined amount of data is received over the input ports when each of the at least two counters exceeds a respective threshold.

In some implementations, the signal processing circuitry includes two multiply-and-accumulate blocks, each multiply-and-accumulate block comprising a pre-adder, two multipliers, and an accumulator. The SPA may further comprise routing circuitry defining a selected mode of operation, which may be selected from a group of modes comprising symmetric scalar multiplication mode, single scalar multiplication mode, complex multiplication mode, mixer mode, superscalar filter mode, oscillator angle mode, and polynomial evaluation mode.

In some implementations, the SPA further comprises an instruction memory unit configured to store microcode for the SPA. The microcode may include instructions that vary cycle-to-cycle, and instructions that are fixed cycle-to-cycle may be stored in memory mapped control registers. The instructions that are fixed may include whether the SPA is a master SPA or a slave SPA. The instructions that are fixed may include a value for at least one threshold parameter for use by the enable block to compare with at least one of the counters. In some implementations, each data memory unit corresponds to an input port in the plurality of input ports, and at least one of the data memory units is implemented as a first-in-first-out buffer.

BRIEF DESCRIPTION OF THE DRAWINGS

Further features of the disclosed techniques, their nature and various advantages, will be apparent upon consideration of the following detailed description, taken in conjunction with the accompanying drawings, in which like reference characters refer to like parts throughout, and in which:

FIG. 8 shows an illustrative diagram an instruction set, in accordance with an implementation;

DETAILED DESCRIPTION

Figure 1:
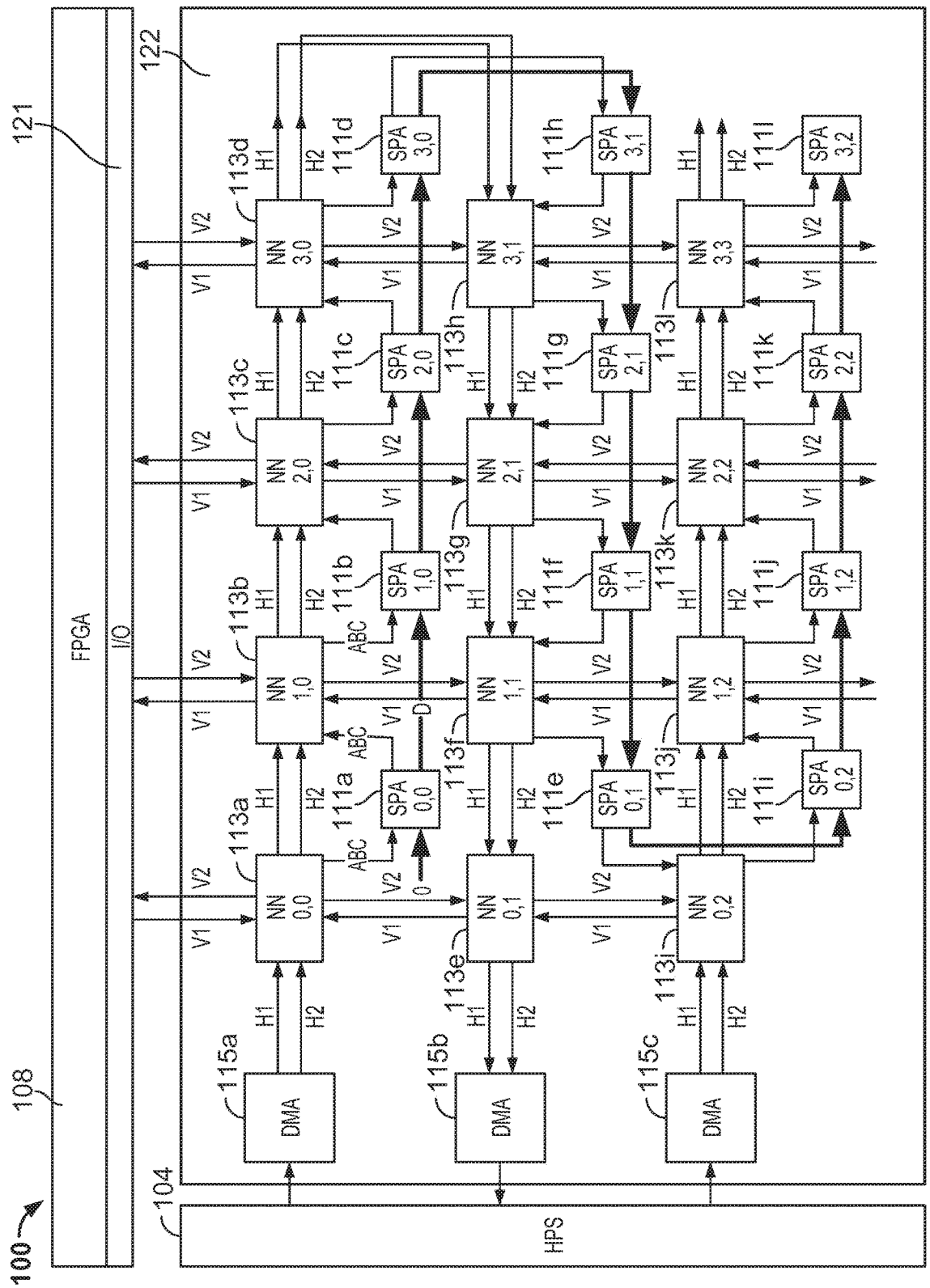
FIG. 1 shows an illustrative floorplan of a hybrid system, in accordance with an implementation.

The systems and methods of the present invention include a hybrid architecture of an integrated circuit for signal processing. Different types of embedded features may operate in concert, connected by specially-purposed busses, such as network-on-a-chip (NoC) systems. Additionally or alternatively, one feature may be connected in a configurable manner to another feature having the same type, thereby constructing a more powerful application-specific accelerator.

It is generally desirable to create integrated circuits that are cheaper and consume less power, while being able to provide desired functionality and maintain a level of programmability. The hybrid architecture described herein uses a programmable architecture that includes a mix of programmable elements, such as FPGAs, accelerators, and processors, for example. Essentially, the hybrid architecture described herein has the low cost and low power consumption properties of ASICs, but has the programmability of FPGAs.

The systems and methods of the present disclosure include an approach to dramatically reduce the cost of important functions in wireless systems, such as finite impulse response (FIR) filters, numerically-controlled oscillators (NCOs), mixers, crest factor reduction (CFR), and digital pre-distortion (DPD). To reduce the cost of these functions, the hybrid architecture described herein uses a network of coarse-grained signal processing accelerators (SPAs). A hybrid architecture for signal processing that included the use of SPAs was previously described in U.S. patent application Ser. No. 14/492,717, the disclosure of which is incorporated herein by reference in its entirety.

As described herein, the SPA may include a single architecture that may implement multiple different functions. It may be desirable for the SPA to have a single architecture to implement different functions (such as a set of functions required in a filter) so as to reduce the communications bandwidth for other components on the device (such as processors and/or the FPGA, for example). If the SPA is able to implement different functions, this reduces the size and power, and improves usability of the device.

In one example, several hundreds of SPAs are connected in a two-dimensional mesh network. The mesh may be statically configured, such as by circuit switching, to set up routes for data to be transferred between SPAs. Each SPA may include four multipliers that process multiple data items to efficiently implement scalar and complex 18-bit fixed-point processing. A SPA may be implemented as a hardened quad-MAC digital signal processor (DSP) engine and may be used to perform most of the processing for digital front end applications. To provide a robust and easy-to-use development model, a SPA may be an accelerator that uses a streaming flow control processing model that automatically handles variability in data availability. To do this, forward-pressure and back-pressure mechanisms may be implemented, and are described in detail in relation to FIG. 9.

FIG. 1 depicts an illustrative floorplan 100 of a hybrid system, in accordance with an implementation. The floorplan 100 depicts various illustrative blocks of a, hybrid system. The floorplan 100 includes a hard processor subsystem (HPS) 104, an FPGA 108, a SPA network region 122, and an I/O interface 121 between the FPGA 108 and the SPA network region 122. As depicted in FIG. 1, the SPA network region 122 includes three direct memory access (DMA) blocks 115a-115c (generally, DMA block 115), twelve SPAs 111a-111l (generally, SPA 111), and twelve network nodes 113a-113e (generally, network node 113). The HPS 104 communicates with the SPA network region 122 using the DMAs 115.

Each SPA 111 is essentially a programmable filtering block that is capable of supporting filtering and related DSP functions. Examples of such functions include but are not limited to polynomial manipulation (in cases that involve digital pre-distortion (DPD), NCO, trigonometry, or any other suitable process, for example), simple gain or mixing, or other arithmetic functions such as $x^n$, $1/x$, log, square root, absolute value, or $x/y$. The set of SPAs 111 may not require any soft logic in the form of a programmable logic element, or any other logic that may be used to configure decision-making that was not envisioned or embedded in the hardened implementation of the device. In one example, the SPAs 111 implement most of the processing required for digital front end applications, including most fixed-point DSP processing. The SPAs 111 may be accelerators that use a streaming flow control processing model that automatically handles the variability in data availability. In particular, the SPAs 111 may use forward pressure and back pressure to allow for changes in data availability and give a robust and easy-to-use development model. One mechanism to provide forward pressure control is described in detail in relation to FIG. 9.

Each of the SPAs 111 may have a memory-memory processor architecture, which means that operations are performed directly on data that is read from a memory unit. This configuration may particularly suitable for acceleration of DSP applications where data items are often only read once before being overwritten. This is explained in detail in relation to FIG. 3.

The hybrid system of FIG. 1 may use an underlying programming model that is similar to Kahn Process Networks (KPN), in which islands of autonomous functionality run in lockstep and are synchronized via blocking reads, in which a process that reads from an empty channel will stall and may only continue when the channel contains sufficient data. In KPN, control is distributed, and data is communicated through FIFO buffers.

Figure 3:
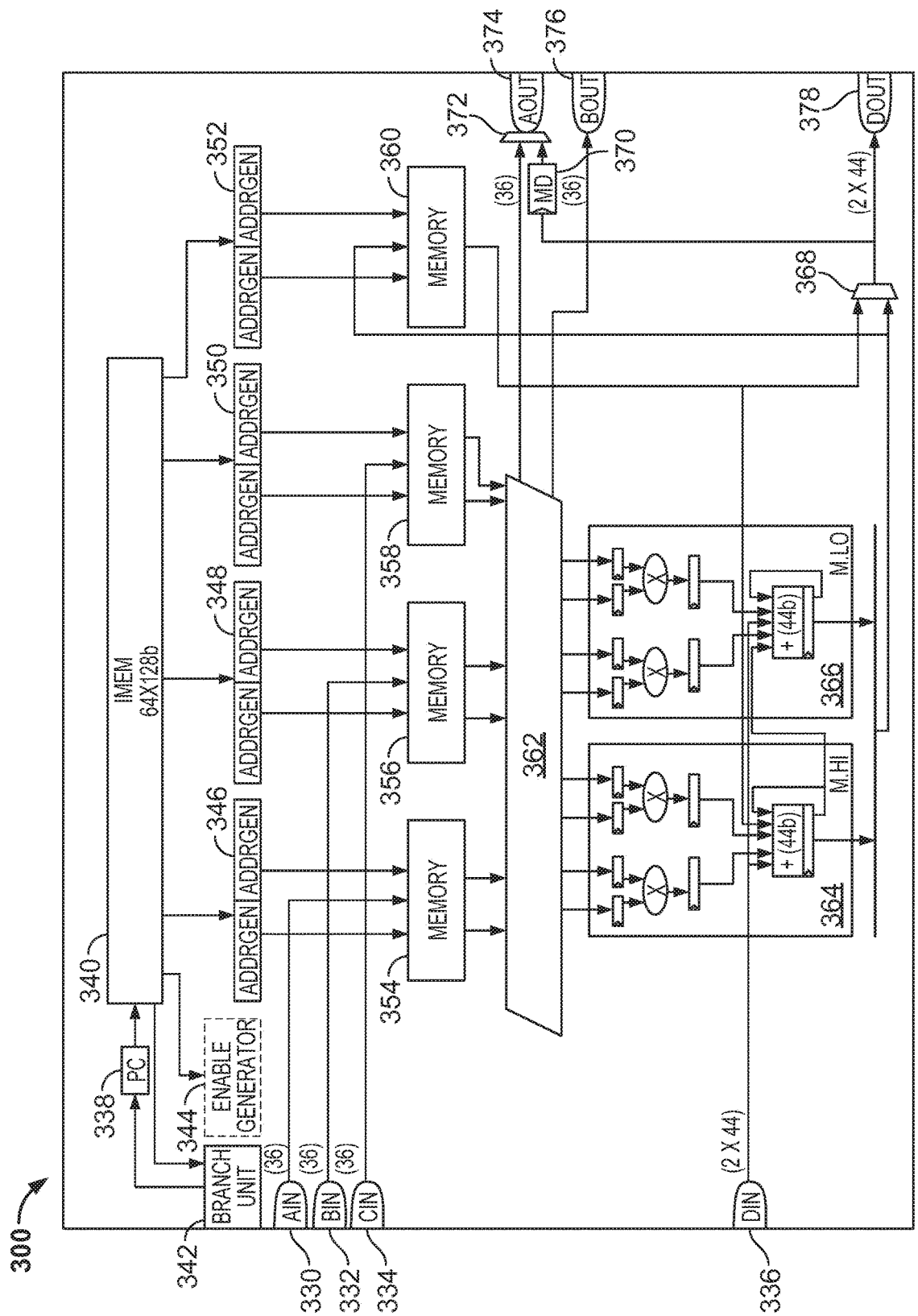
FIG. 3 shows an illustrative block diagram of a SPA, according to an illustrative implementation.
Figure 4:
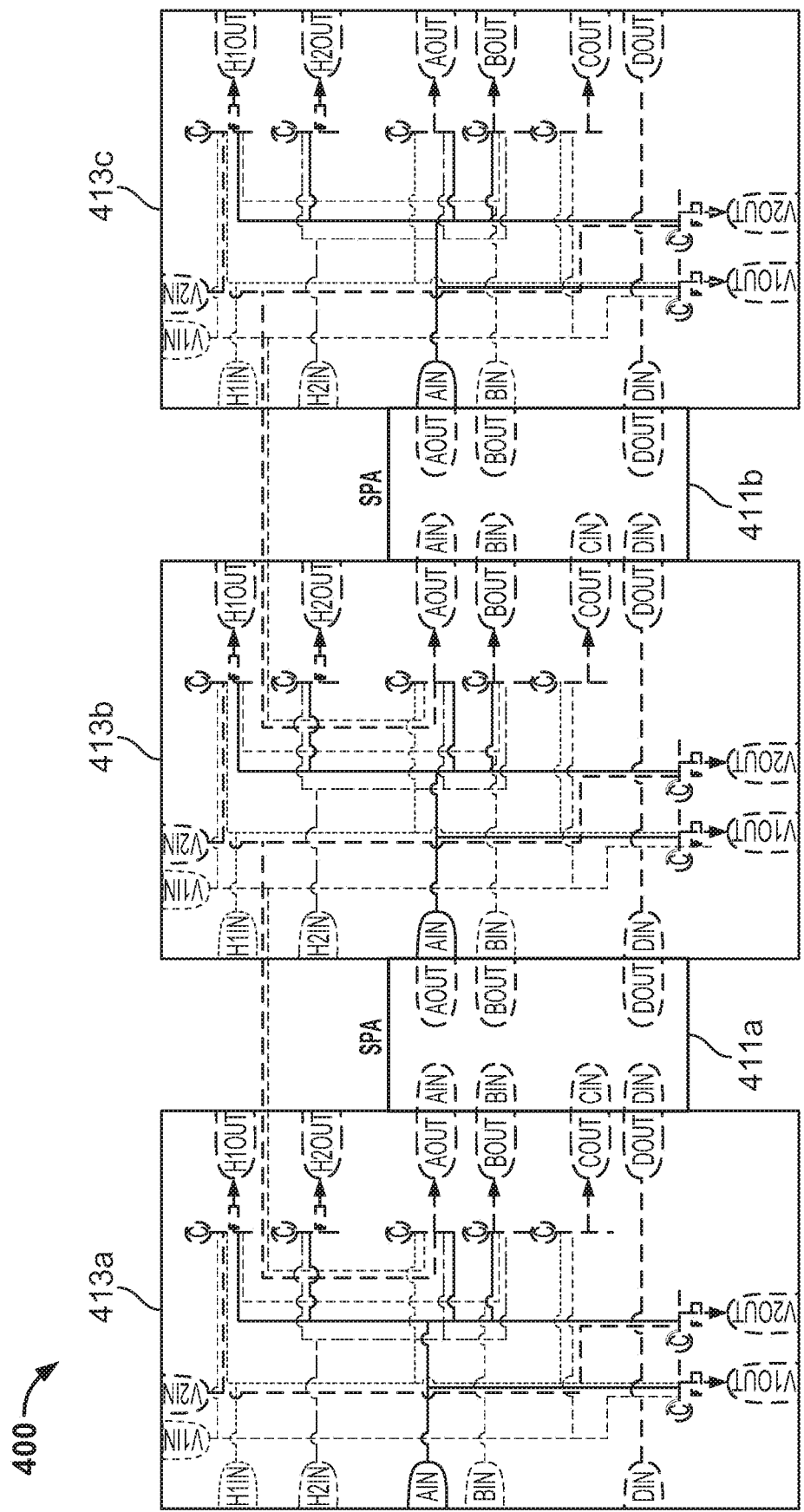
FIG. 4 shows an illustrative block diagram of two SPAs and three network nodes, according to an illustrative implementation.

Various examples of the components of each SPA 111 are shown and described in relation to FIGS. 3, 5, 9, 11, and 12, and an example of the components of each network node 113 is shown and described in relation to FIG. 4. As is described in more detail in relation to FIG. 3, the SPAs 111 may support functions such as filtering including complex filtering, polynomial manipulation, fixed point arithmetic, square root, division, and other similar functions. Moreover, as is described in relation to FIGS. 5, 10, and 12, multiple SPAs may be configured to cooperate together to perform a function that is larger than one SPA may perform by itself. In particular, low-latency connections may be formed between corresponding input and output ports of two SPAs.

The hybrid system of FIG. 1 may be designed for implementing a digital front end (DFE) system. In this case, the network of SPAs 111 may support the processing performed in the filtering and polynomial manipulation for digital up conversion (DUC), digital down conversion (DDC), numerically controlled oscillator (NCO), crest factor reduction (CFR), and digital pre-distortion (DPD). The HPS 104 supports functionality related to control and monitoring, and a separate hard DSP subsystem (not explicitly shown in FIG. 1) may support functionality related to matrix inversion, FFT processing, low-sample rate DSP, and floating point arithmetic.

The SPA network region 122 may be configured using a statically routed, circuit-switched, multi-stage mesh network. The SPAs 111 are connected to one another using a dedicated high speed interconnect array that provides conflict-free, guaranteed speed data links. Each SPA has a unique address and can be configured by memory mapped write commands from a processor during setup, or at runtime to provide dynamic behavior. Each SPA 111a-111e is associated with a respective input network node 113a-113e, which provides three inputs A, B, and C to its associated SPA. Each of the SPAs 111a-111l then provides three outputs A, B, and C to a different network node 113. For example, as is shown in FIG. 1, SPA 111a receives inputs from network node 113a and provides outputs to network node 113b. The network nodes 113 may be dynamically reprogrammable such that the operation of the associated SPAs may be changed at runtime. In particular, each network node 113 may determine how to operate its associated SPA 111, and may determine how the connections between SPAs are formed. For example, each corresponding network node 113 may implement the global segmented routing for its associated SPA 111.

The SPAs 111 are connected to one another over the network nodes 113, which form an interconnect network that may include multiplexers controlled by writable registers. The interconnect network enables data to travel between SPAs 111 in a synchronous manner. In an example, each hop between two adjacent SPAs 111 is performed over a network node 113 and adds one cycle of latency for each unit distance travelled on the global horizontal (H) and vertical (V) lines. As shown in FIG. 1, data may move left to right along the top row and the bottom row, and right to left along the middle row of the SPA network region 122. Similarly, data can move up and down on each column. This allows design using a model of one long linear arrangement of SPAs, or a 2 dimensional grid, depending on the application. Moreover, as is shown in FIG. 1, two vertical (V) lines and two horizontal (H) lines are connected to each SPA in each direction. In general, one of ordinary skill in the art will understand that the number of vertical and horizontal lines may be any suitable number, and may be different from each other, without departing from the scope of the present disclosure.

For example, as is shown in FIG. 1, the vertical lines V1 direct data from one network node upwards to another network node, and the vertical lines V2 direct data from one network node downwards to another network node. For each column of network nodes, the vertical lines V1 are shown to the left of the vertical lines V2, such that the vertical wiring alternates direction twice per column. In some implementations, wiring may be saved if for every other column (such as the second and fourth columns in FIG. 1, which include the network nodes 113b, 113f, 113j, 113d, 113h, and 113l), the vertical line V1 was positioned to the right of the vertical line V2. In this case, two upward vertical lines V1 would be adjacent to each other (e.g., the vertical line V1 from the network node 113b and the vertical line V1 from the network node 113c), and two downward vertical lines V2 would be adjacent to each other (e.g., the vertical line V2 from the network node 113a and the vertical line V2 from the network node 113b), such that half the wiring may be used.

In some implementations, processing using the hybrid system of FIG. 1 is done with a long chain of SPA processing functions with modest routing bandwidth. All of the functions may be streaming, and unlike processing of orthogonal frequency division multiplexing (OFDM) data, may not need to block up large quantities of data. In particular, it may be inefficient to configure a routing circuitry as a two-dimensional grid, which may use a large amount of expensive general purpose wiring that consumes power. However, for many applications, data is often processed in a long one-dimensional chain, rather than in a two-dimensional grid. In this case, the wiring for the grid may be wasted.

Many digital front end applications involve linear chains of processing elements that have well-defined communication between processing elements. There may be a small number of communications links between processing elements, but the links may be heavily utilized. Because there is a small number of heavily used links, the interconnects may be statically configured. By implementing a statically configured interconnect network, some runtime uncertainties may be avoided. For example, packet-based networks-on-chip (NoCs) may cause uncertain latencies due to stalling and data collisions, or deadlock and livelock situations.

As shown in FIG. 1, the SPAS 111 are arranged in a two-dimensional grid of three rows and four columns. However, if desired, the configuration of the SPAS 111 may be considered as a one-dimensional chain that folds around the ends of the rows to form a single large chain. At any point along the chain (e.g., at any SPA 111), input or output data may be provided.

The network nodes 113 may be configured to pass any sort of data between SPAS or to and from SPAs. For example, a network node 113 may pass data from one SPA to another SPA using unregistered connections, global data (potentially switching direction), data from one SPA onto the global network, or data from the global network to a SPA. Such passed data may include debug data between a control processor and a SPA, microcode data from a processor to one or more SPAs, and a Control and Status Register (CSR) update to one or more SPAs (described in detail in relation to FIG. 6). Moreover, a network node 113 may broadcast data to one or more SPAs. As is shown in FIG. 1, data may traverse the SPA network region 122 along local connections (e.g., A, B, C, D ports) to the SPAs 111 themselves, or along global connections (e.g., H1, H2, V1, V2) between the network nodes 133.

In some implementations, the local connections involve A, B, and D ports on each SPA 111. As is explained in detail in relation to FIG. 3, the A and/or B ports may receive data inputs. In an example, the A and B ports are each 38 bits, and the D port is 88 bits. In this case, the A and B ports each allow two 18-bit paired signals to be communicated to the SPA 111 every cycle. For example, the two 18-bit paired signals may include separate I/Q pairs, two channels of scalar data, or I+Q complex numbers. The D port may provide for the communication of two full-precision accumulator values each cycle. In some implementations, the larger width of the D port may allow for the formation of large FIR filters without truncating any intermediate data.

In some implementations, it may not be desirable for data to pass through the local connections for a particular SPA 111. For example, a SPA 111 may be skipped if it is currently being used or is otherwise unavailable. In this case, using the global connections H1, H2, V1, and V2 (or any suitable combination thereof) may be used to traverse the SPA array and bypass any of the SPAs 111. In particular, the global connections, such as the H1, H2, V1, and V2 connections may be used to pass data directly between network nodes. In an example, switches and/or multiplexers may be used to connect the local wires (such as the internal connections within a SPA) with the global wires (such as H1, H2, V1, and V2, for example). This routing circuitry may be controlled by writable control bits that are connected into the mesh network.

In some implementations, the global connections may transfer data that includes 40-bit words. Each 40-bit word may include 36 bits of data, a valid bit, a mode bit, and two bits of context data. The valid bit may indicate valid data, and may be used as a write enable for the destination block. The mode bit may allow user data and control to pass over the same wires. The two bits of context data include some side information in parallel with the actual data signals. The context data may indicate some property of the data that is interpreted by the SPA 111 on a case by case basis. In an example, the context bits may be used for determining which coefficient bank is to be used with the data when there are multiple bank filters, such as in DPD. In this manner, the context bits allow for a controlled and mathematically correct transition from one set of coefficients to another set of coefficients, with no breaks in processing. The 36 data bits may allow for transfer rates of 2G 18-bit samples/second per link. With five links available horizontally (e.g., A, B, C, H1, and H2), and two links available vertically (e.g., V1 and V2), each SPA has access to approximately 14 gigasamples/second.

As described above, the valid bit may be indicative of an enable signal that informs the SPA 111 whether the processing of the incoming data should begin. It may be desirable for the SPAs 111 to operate autonomously from one another. For example, a SPA 111 may be stalled from processing the data until a certain amount of input data has been received. This input data may arrive over an indeterminate number of clock cycles. In this way, because the timing of the processing in SPA 111 may not be determined statically, the use of the enable signal may allow for the SPAs 111 to begin processing data only after the requisite amount of data is received. Moreover, the use of the enable signal is able to handle any irregular output data that is provided by any of the SPAs 111, such as in multi-rate designs.

The HPS 104 includes one or more processors that configure and update the contents of the SPA network region 122 (e.g., coefficients, program memory, and any other contents of a SPA) at boot time, or at any time that the system is running. This may occur over a configuration bus (not shown) between the HPS 104 and the SPA network region 122. In one example, the HPS 104 includes one or more ARM processors with memory mapped components.

The HPS 104 communicates with the SPA network region 122 by transmitting and receiving data over the DMAs 115. In particular, the DMAs 115 essentially form a bridge between the memory-mapped domain of the HPS 104 and the flow controlled, streaming domain of the SPAs 111. The DMAs 115 may perform any combination or all of the following functions. First, to facilitate data transfer from the HPS 104 to the SPAs 111, an HPS component (such as an ARM processor) may configure the DMAs 115 to transfer blocks of data from memory in the HPS 104 to the streaming interconnect network of the SPAs 111. As is described in relation to FIG. 9, the SPAs 111 may be configured to have a back-pressure mechanism, such that the flow of data transfer to a particular SPA is controlled. The back-pressure mechanism ensures that data is transferred reliably.

Second, to facilitate data transfer from the SPAs 111 to the HPS 104, the DMAs 115 may be configured to transfer data blocks from the streaming interconnect network of the SPAs 111 to memory in the HPS 104. Third, to facilitate configuration of the SPAs 111, the one or more processors in the HPS 104 may write to the DMAs 115, where registers may be mapped into the address space of the HPS 104. In this case, the configuration data may be used to set up any of the components in the SPAs 111, for updating coefficients (such as for DPD adaptation, for example), or any suitable dynamic control.

The FPGA 108 may include a flexible array of uncommitted logic elements and hardened elements such as DSP blocks, high speed I/O, and memory units. The FPGA 108 communicates with the SPA network region 122 over the I/O interface 121, which may use a streaming protocol on a data bus that may be 40 bits wide in a format for a streaming protocol that is similar to the AXI streaming protocol. In some implementations, the physical interface may write to and from the boundary wires of the FPGA at a speed of one GHz.

In some implementations, the sample rate of the incoming data is slower than the clock rate of the SPAs 111. For example, an antenna that receives incoming data may operate at 16 MHz, while the device's clock speed may be 1 GHz. In this case, the same SPA 111 may implement multiple steps of calculations in a single cycle of incoming data. To accommodate this, the microcode of the SPAs 111 may need to be flexible to handle the differences in data and device clock rates.

As is shown in FIG. 1, only twelve SPAs 111 and twelve network nodes 113 are shown. The configuration of FIG. 1 is shown for illustrative purposes only, and one of ordinary skill in the art will understand that the hybrid systems described herein may include any suitable number of SPAs and network nodes, in any suitable configuration.

Figure 2:
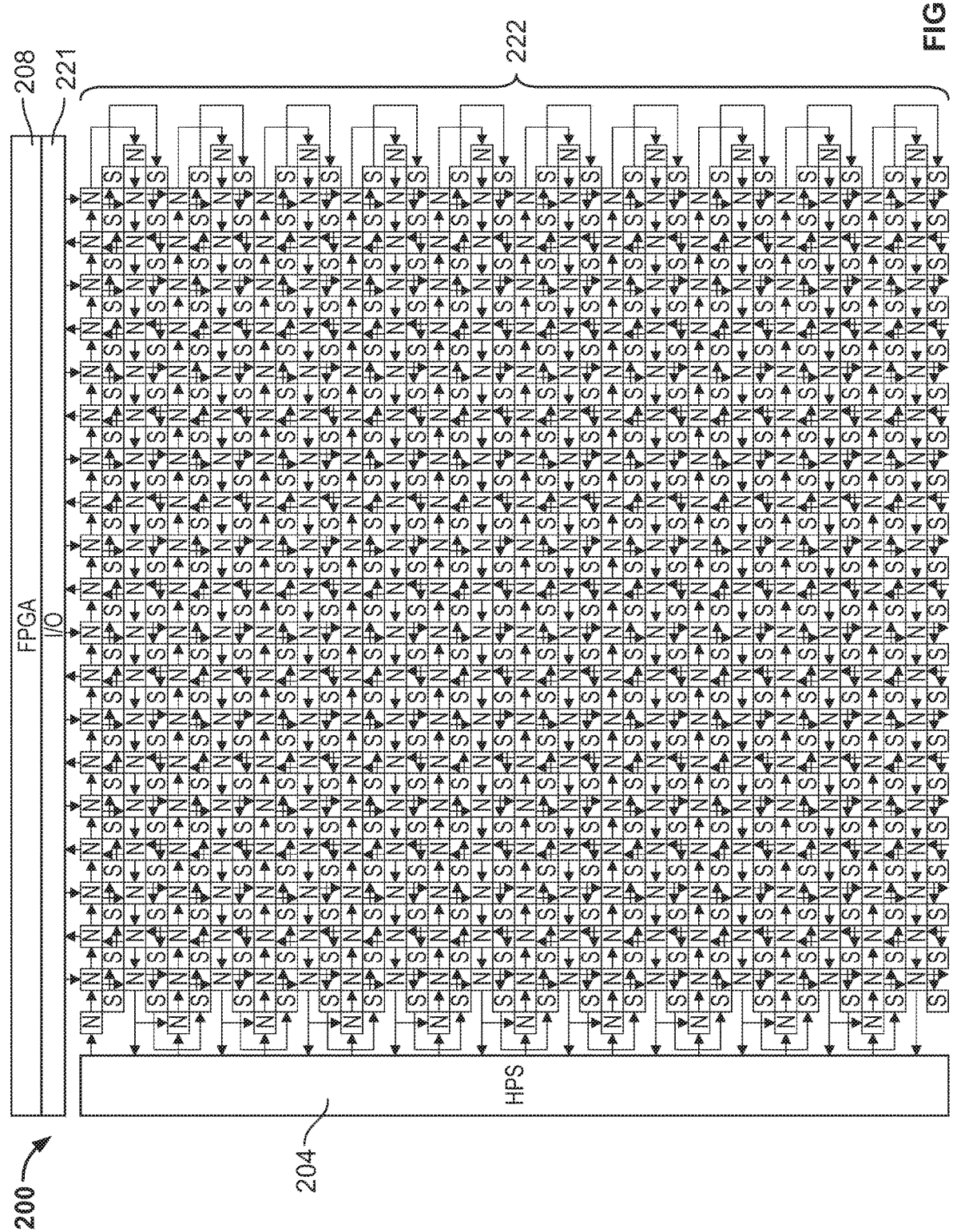
FIG. 2 shows an illustrative floorplan of a large hybrid system, in accordance with an implementation.

FIG. 2 depicts an illustrative floorplan 200 of a large hybrid system, in accordance with an implementation. The floorplan 200 is similar to the floorplan 100 of FIG. 1, and includes an HPS 204, an FPGA 208, a SPA network region 222, and an I/O interface 221 between the FPGA 208 and the SPA network region 222. However, the SPA network region 122 of FIG. 1 includes only twelve SPAs, while the SPA network region 222 of FIG. 2 includes 400 SPAs arranged in a 20×20 grid. The arrangement of multiple SPAs in a two-dimensional grid or a one-dimensional array may be referred to as a mesh routing fabric. The fabric effectively forms a configurable interconnect network that determines how the SPAs are connected, and the control signals that are used for selecting the appropriate inputs for the various SPAS may be set at configuration time of the FPGA 208. In general, any number of SPAs and network nodes may be used, in any suitable aspect ratio, such as a 3×3 grid, a 4×4 grid, a 4×16 grid, 1×64 array, or any other suitable grid or array size. FIG. 2 only depicts a portion of the connections and detail shown in FIG. 1, but one of ordinary skill in the art will understand that the connections of the hybrid system of FIG. 2 may include some of all of the connections shown and described in relation to FIG. 1.

The connections shown in FIGS. 1 and 2 may include one or more data busses, and indicate that each SPA may receive an input from its nearest neighbor, or it may be bypassed completely. In this manner, the SPAs are optionally involved in the processing, which allows for flexible routing of data. Furthermore, each SPA that is positioned at an endpoint of a row or column may be configured to accept an input from the other end point of that row or column, thereby providing a mesh or grid-like structure to the network.

FIG. 3 is an illustrative block diagram of a SPA 300 and its components, according to an illustrative implementation. The microarchitecture of the SPA 300 that is shown in FIG. 3 is a simplified diagram that shows the main memory units and data paths of the SPA 300. The SPA 300 may be used to implement any or all of the SPAs 111 shown and described in relation to FIGS. 1 and 2. The SPA 300 includes four input ports 330, 332, 334, and 336 and three output ports 374, 376, and 378. The SPA 300 further includes an instruction memory unit (IMEM) 340, a program counter 338, a branch unit 342, an enable generator 344, four address generation units 346, 348, 350, and 352, four memory units 354, 356, 358, and 360, a mode selector 362, two MAC blocks 364 and 366, a register 370, and two multiplexers 372 and 368.

A SPA may have a relatively small number of input ports and a small number output ports. The relatively smaller number of input and output ports causes the SPA to be more efficient than existing FPGAs for applications such as FIR filters. In particular, the number of input and output ports for a SPA may depend on the dimensions of the array or mesh of SPAs, where the larger the array or mesh, the higher the number of input and output ports. In an example, as is shown in FIG. 3, the SPA 300 may have just four input ports and four output ports (output port Cout not shown), and most of the input and output ports have the same width, which is shown as 36 bits wide. In contrast, an FPGA may be configured to be able to route to and from anywhere on a chip. By restricting the numbers of inputs and outputs of a SPA and arranging the SPAs in an array or a mesh, the present disclosure limits the flexibility of the connections but saves on power consumption and improves efficiency.

As is shown in FIG. 3, the SPA 300 includes five memory units, including the IMEM 340 and four memory units 354, 356, 358, and 360. The memory units 354, 356, and 358 may be referred to herein as AMem, BMem, and CMem, respectively. These memory units may implement delay lines, queues, FIFO buffers, general data storage, or any suitable combination thereof. Each of the memory units 354, 356, and 358 may provide 64 words of 38-bit data (such as two 18-bit data words and two bits of context data, for example). The sizes of these memory units may determine the efficiency of the hybrid system, since the sizes of the memory units consume a significant amount of the silicon area. The context data is described in relation to FIG. 6 and provides dynamic datapath control, such as coefficient bank selection. The context data may be particularly useful because there is limited control overhead for a processor, such as the HPS 104. The memory unit 360 may be referred to herein as DMem, and provides data storage for wide accumulator data. In particular, the memory unit 360 may be 88 bits wide, providing for two 44-bit accumulators in parallel. Some or all of the memory units shown in FIG. 3 may include a single read port and a single write port, thereby allowing for continuous operation of filters.

In an example, the memory units of the SPA 300 may be balanced to provide two 18-bit values to be read from each of the memory units 354, 356, and 358. In particular, the memory units 354 and 356 may be used to implement delay lines in symmetric real FIR filters, and the memory unit 358 may be used to store filter coefficients. The memory unit 360 may be used to store wide accumulator data, and may allow full accumulation of partial values before final rounding.

The IMEM 340 stores microcode that may be writable by a control processor, such as the HPS 104, which may include cycle-by-cycle instructions that control the datapath of the SPA 300. Several static configuration registers may be used that apply to all instructions, and may correspond to unchanging aspects of the SPA 300, such as rounding and saturation modes, port connectivity, and enable setup. Each of the four address generation units 346, 348, 350, and 352 may calculate addresses to access a corresponding memory unit 354, 356, 358, and 360, respectively. In particular, the address generation unit may use one or more local register files to generate a new address once every clock cycle. The local register files may each include eight registers, though in general, register files of any size may be used.

While the address generation units 346, 348, 350, and 352 calculate addresses, a DSP operation may be performed on the input data that is received over the input ports. These input ports to the SPA 300 may be data driven, such that all data that is received through those ports (flagged with a valid signal on the bus) may be written to the relevant memory (data from input port 330 ("Ain") is written into memory unit 354 ("AMem"), data from input port 332 ("Bin") is written into memory unit 356 ("BMem"), and data from input port 334 ("Cin") is written into memory unit 358 ("CMem")) in a round-robin fashion. In this way, the memory units may be configured as FIFO buffers, such that the flow control between memory units is decoupled. Moreover, the memory unit 360 ("DMem") may be memory mapped, and accessed via dedicated address registers that are updated by the microcode stored in the IMem 340. This allows data to be re-read as may be required by multi-rate filters, and is performed flexibly under the control of a microcode program. In particular, at least some of the control signals may be dynamic and may change each cycle (based on direction from the microcode that is stored in the IMEM 340).

As is shown in FIG. 3, each of the MAC blocks 364 and 366 includes two multipliers and an accumulator. With both MAC blocks 364 and 366, the SPA 300 includes four multipliers and two accumulators. By configuring the two MAC blocks 364 and 366 to operate in parallel, the SPA 300 may be configured to allow two parallel FIR channels to be calculated. The configuration of the SPA 300 may also allow a multiply-accumulate operation to process a single complex data stream. The configuration of the MAC blocks in FIG. 3 is shown for illustrative purposes only, and in general, any number of MAC blocks and any number of multipliers or accumulators may be used.

As is shown in FIG. 3, several data buses are shown as having particular widths. For example, the data received via input ports 330, 332, and 334 are each 36 bits wide, while the data received via input port 336 is 2×44 bits wide. One of ordinary skill will understand that these numbers are included for illustrative purposes only, and that any suitable data bus widths may be used without departing from the scope of the present disclosure.

In FIG. 3, the outputs of the two MAC blocks 364 and 366 are fed into a multiplexer, whose output is then fed to the memory unit 360 and into another multiplexer 368 before being provided to the output port 378 and the round register 370. The output of the round register 370 is selectively provided to the output port 374 via the multiplexer 372. The round register 370 may perform a right-shift by N bits (where N=0, 1, 2, 3 . . . 18) with symmetrical saturation and rounding.

In an example, when two 18-bit numbers are multiplied, the output of the multiplier may be a 36-bit result, which may be stored in the memory unit 360 DMem with some additional guard bits to allow several values to be added together without the risk of overflow. The result may be 44 bits of values, though the relevant result may include only 18 of these bits. The relevant bits may be those bits that are near the most significant bits, but may not necessarily correspond to the 18 most significant bits. To obtain the relevant bits, the resulting 44 bits may be shifted to the right by a shift amount. The shift amount may be determined based on a tradeoff between the danger of discarding high bits that represent a significant part of the result, and the low bits that represent small fractions. Moreover, saturating the result may clip the result to a sensible value, and may be used to avoid wrapping, which may lead to nonsensical values. The lower bits may be rounded, such as by selecting a value that is close to the actual value using a rule.

The mode selector 362 includes routing circuitry for properly defining a mode of operation for the SPA 300. In particular, the routing circuitry may include a set of multiplexers and/or switches and is configured to manipulate data into a form used by a particular mode. The SPA 300 may be configured to operate in different modes. In one example, the SPA 300 is configured to operate in a complex multiplication mode. In this case, memory unit 356 and memory unit 358 may store coefficient banks, and data stored in memory unit 354 may select which coefficient bank to use. In other examples, the SPA 300 may be configured to operate in a single instruction, multiple data (SIMD) mode (which may operate on two channels), a complex MAC mode, a long addition for NCO phase accumulation, or a unary function evaluation (such as sin, cos, sqrt, or any other suitable function operable on a single argument).

In one example, the SPA 300 may be configured to implement a SIMD operation. In this case, there may be two SIMD lanes operating in parallel for each instruction. Data may be read from each of the memory units 354 and 356 in pairs of 18-bit data items. One pair may be considered as two separate I and Q channels, or as a single complex sample with real and imaginary parts. In some implementations, additional SIMD lanes may be included in a SPA, thereby providing a more powerful SPA unit.

Functions that may be supported by the SPA 300 may include any of the following eight modes, where a.hi corresponds to the 18 left bits of the 36-bit input at input port 330 (Ain), a.lo corresponds to the 18 right bits of the 36-bit input at input port 330 (Ain), b.hi corresponds to the 18 left bits of the 36-bit input at input port 332 (Bin), b.lo corresponds to the 18 right bits of the 36-bit input at input port 332 (Bin), c.hi corresponds to the 18 left bits of the 36-bit input at input port 334 (Cin), c.lo corresponds to the 18 right bits of the 36-bit input at input port 334 (Cin), m.hi corresponds to the 44-bit output of the MAC block 364, m.lo corresponds to the 44-bit output of the MAC block 366, and "X+=Y" corresponds to a shorthand expression for "X=X+Y":

1. Dual Channel Symmetrical Scalar Mode:
   m.lo+=a.lo*c.lo+b.lo*c.lo;
   m.hi+=a.hi*c.hi+b.hi*c.hi; //duplicate c.lo into c.hi for same coefficients
2. Dual Channel Single Scalar Multiplication Mode
   m.lo+=a.lo*c.lo;
   m.hi+=a.hi*c.hi; //duplicate c.lo into c.hi for same coefficients
3. Complex Multiplication Mode (imag, real) in (hi, lo)
   m.lo+=a.lo*c.lo−a.hi*c.hi;
   m.hi+=a.lo*c.hi+a.hi*c.lo;
4. Mixer Mode
   m.lo+=a.lo*b.lo−a.hi*b.hi;
   m.hi+=a.lo*b.hi+a.hi*b.lo;
5. Superscalar FIR Mode
   m.hi=a.hi*c.hi+b.lo*c.hi;
   m.lo=m.hi+a.lo*c.lo+b.lo*c.lo;
6. NCO Angle Mode
   m.lo+=d.lo
   m.hi+=d.hi
7. Horner/Estrin Polynomial Evaluation Mode
   $P_3(x)=C0+x\ (C1+x\ (C2+C3*x))$
   $P_3(x)=(C0+C1*x)+(C2+C3*x)\ x^2$
8. 36 b×36 b Multiplication Mode
   The SPA described herein has enough resources to implement 36 bit by 36 bit multiplications for FIR filters.

9. 36 b×18 b Multiplication Mode

Even though not all of the resulting 54 bits of output from this mode may be stored, the lower bits may be rounded away at a later stage. This mode may be particularly useful in approximations to unary functions where the numerical accuracy of each stage may be analysed.

In some implementations, control may be provided by using a program counter that is advanced as a sequence of processing steps are progressed in a SPA. Moreover, loops may be implemented using repeat instructions and branch instructions. An example of this is shown below in the assembler code for a symmetrical 8-tap FIR filter.

```
1: block fir8s (a:ain, b:bin, q:aout)
2:   _entry:            movi a0, -1 |  movi b0, -4;
3:   _loop:   wait 1,1  | addmul d0, [a0]-1, [b0]1, [c0]1;
4:            rpt 3     | addmac d0, [a0]-1, [b0]1, [c0]1;
5:            br _loop  | mov [b0]1, [a0] | mac.wa d0, [a0]5, [c0]-4;
6: end
```

On line 1 in the above example, the block is named (fir8s), and the used ports are specified (ain, bin, aout), such that another SPA may be connected to the input or output of the present SPA. One line 2, a value of −1 is placed in register a0, and a value of −4 is placed in register b0. On line 3, the "wait 1,1" statement indicates a command to wait until one word of data has been received on the A input before proceeding to issue the remainder of this instruction. On line 4, the "rpt 3" statement indicates a command to repeat three times. In particular, the value for the inputs may be read from the Ahem, BMem, and CMem memory units using the values in address a0, b0, and c0, and the values are then incremented (or decremented for the a0 register) to modify the addresses, which are used to obtain the next piece of data during the next cycle. On line 5, the statement "mac.wa" has a suffix ".wa", which indicates writing the result to AOut. The write operation (which may correspond to setting the valid bit signal described in relation to FIG. 1) on AOut may be delayed until the pipeline is complete. Also on line 5, the same value read from aMem ([a0]) is written to bMem at address [b0]. This path may be followed via the SPA routing node. Moreover, in line 5, the value in the register a0 is incremented by 5 and the value in the register c0 is decremented by 4, such that the modified address is used to obtain the next piece of data during the next cycle.

FIG. 4 depicts a block diagram of a system 400 that includes three adjacent SPAs and two network nodes, according to an illustrative implementation. As described in relation to FIG. 1, each SPA 411a and 411b is associated with a network node 413a and 413b, respectively. The third network node 413c receives some of its inputs from the second SPA 411b. In FIG. 4, the internal components and connections of the network nodes are shown, and are the same across the three network nodes 413a, 413b, and 413c. The components of the network node 413a are described herein in detail, but the description of the network node 413a is analogous to the network nodes 413b and 413c, or any other network node.

The network node 413a includes seven input ports V1in, V2in, H1in, H2in, Ain, Bin, and Din and eight output ports H1out, H2out, Aout, Bout, Cout, Dout, V1out, and V2out. Each output port, except Dout, has a corresponding multiplexer with a selection signal denoted by "C", which may be a different selection signal for each multiplexer. The multiplexers shown in FIG. 4 may not include all possible inputs so as to save connections and area on the network node 413a. Such a multiplexer may be referred to as "depopulated." Moreover, a register is positioned between the multiplexer and the port for each of the output ports H1out, H2out, V1out, and V2out. As depicted in FIG. 4, the signal sent to H1out is selected from V1in, V2in, H1in, Ain, and Bin. The signal sent to H2out is selected from H2in and Ain. The signal sent to Aout is selected from V1in of the network node 413b, V2in of the network node 413b, H1in, H2in, and Ain. The signal sent to Bout is selected from Ain, Bin, and H2in. The signal sent to Cout is selected from V1in and H1in. The signal sent to Dout is Din. The signal sent to V1out is selected from V1in, Ain, and H1in. The signal sent to V2out is selected from V2in and Ain.

Figure 5A:
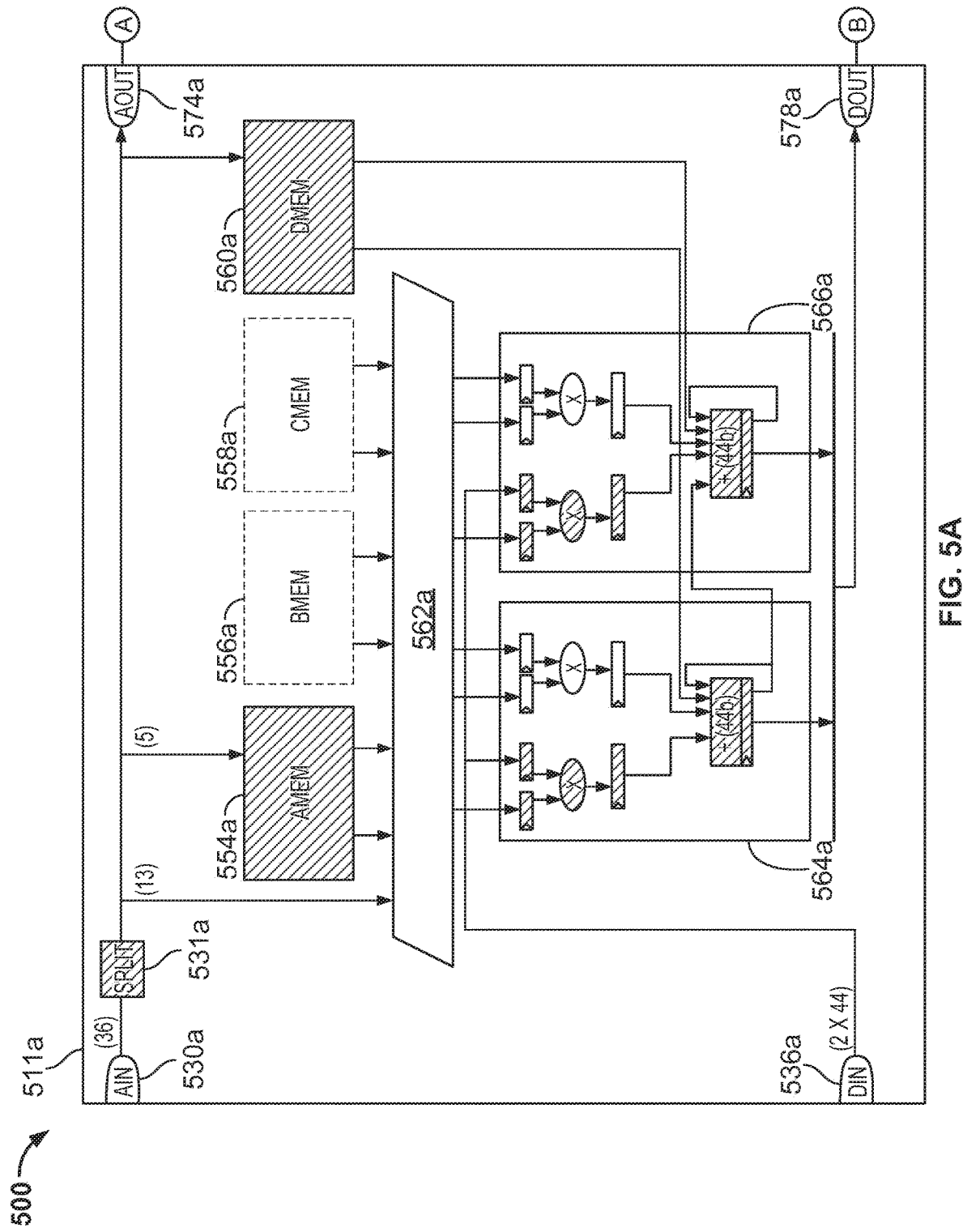
FIGS. 5A and 5B show an illustrative block diagram of two SPAs implementing a unary function, in accordance with an implementation.
Figure 5B:
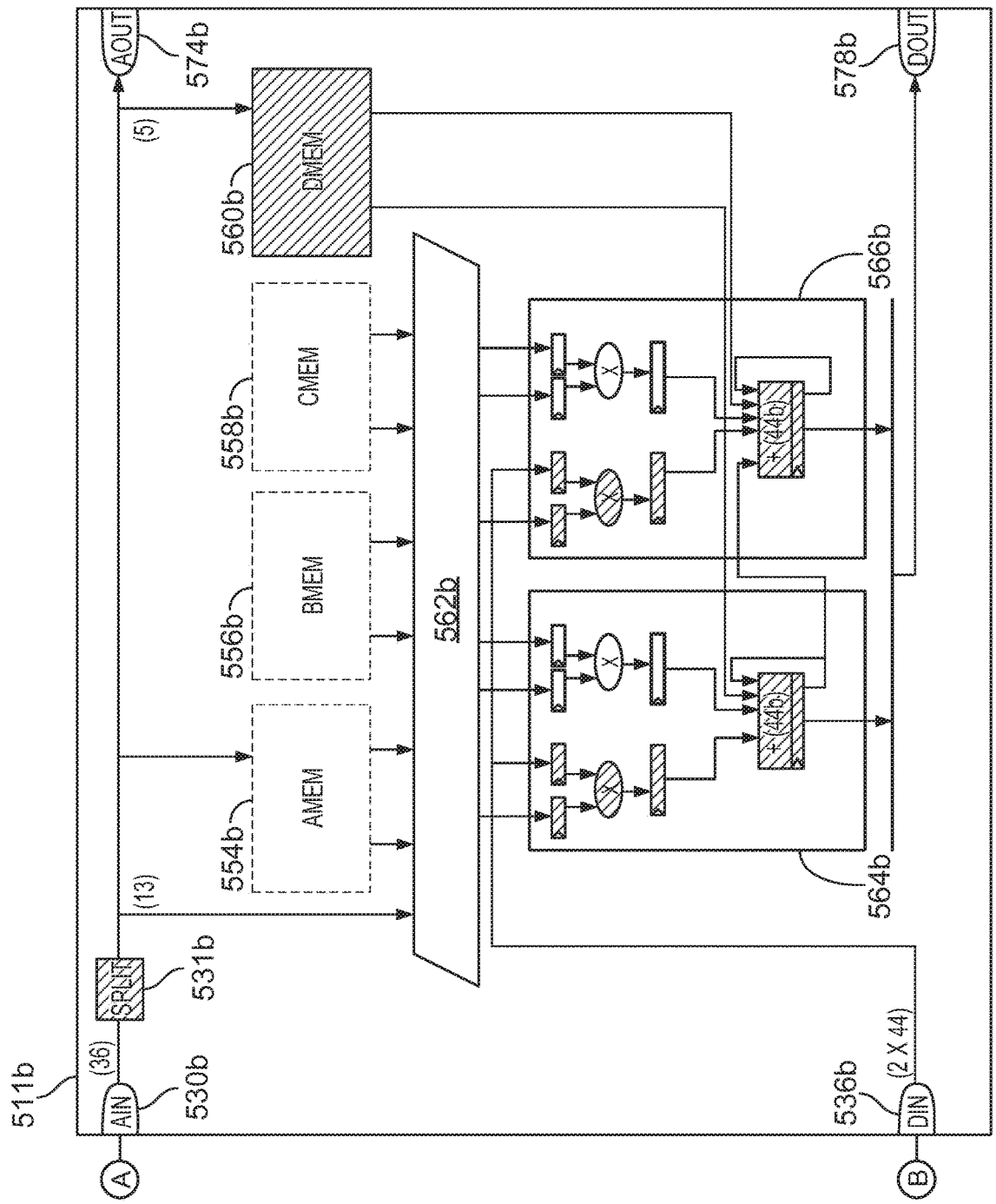

FIGS. 5A and 5B (FIG. 5) depicts two adjacent SPAs 511a and 511b used to implement a trigonometric function, according to an illustrative implementation. The components of the SPAs 511a and 511b are a simplified version of those described in relation to FIG. 3. For example, the IMEM, program counter, enable generator, branch unit, and address generation units of the SPA 300 are not shown in FIG. 5, but one of ordinary skill in the art will understand that the SPAs in FIG. 5 may include these components. Moreover, the input ports Bin and Cin and the output port Bout are not shown in FIG. 5 because these ports may not be needed to implement the trigonometric function.

As depicted in FIG. 5, SPA 511a includes two input ports Ain (530a) and Din (536a), two output ports Aout (574a) and put (578a), a splitter 531a, four memory units 554a, 556a, 558a, and 560a, a mode selector 562a, and two MAC blocks 564a and 566a. As discussed above, not all components of SPA 511a may be depicted in FIG. 5. Moreover, some of the depicted components of SPA 511a are not used. For example, memory units 556a and 558a may not be necessary for implementing the trigonometric function, and therefore may be unused. SPA 511b includes similar components as SPA 511a. For example, input ports 530a and 536a are similar to input ports 530b and 536b; output ports 574a and 578a are similar to output ports 574b and 578b; splitter 531a is similar to splitter 531b; memory units 554a, 556a, 558a, and 560a are similar to memory units 554b, 556b, 558b, and 560b; mode selector 562a is similar to mode selector 562b; and MAC blocks 564a and 566a are similar to MAC blocks 564b and 566b. The exception is that memory units 554b, 556b, and 558b may not be used for implementing the trigonometric function.

The two SPAs 511a and 511b are used together to generate a sine function and a cosine function to 18 bit accuracy. In particular, the angle argument x is provided via the input port 530a to the SPA 511a, which directly feeds the angle argument x to the output port 574a of the SPA 511a and the input port 530b of the SPA 511b. Within the SPA 511a, the input data x is routed to the MAC blocks 564a and 566a via the memory unit 554a and the mode selector 562a. While the MAC block 564a performs a sine computation, the MAC block 566a performs a cosine computation, resulting in a preliminary result. The preliminary results output by the MAC blocks 564a and 566a are provided to a multiplexer, which selectively provides one of these outputs to the output port 578a. The input port 536b of the SPA 511b receives the provided output from the output port 578a, and forwards the data to the two MAC blocks 564b and 566b, which further computes the sine and cosine functions, respectively. The outputs of the MAC blocks 564b and 566b are also provided to a multiplexer, which selectively provides one of these outputs to the output port 578b. In the diagram shown in FIG. 5, the shaded components are those that are active during this process.

Figure 6:
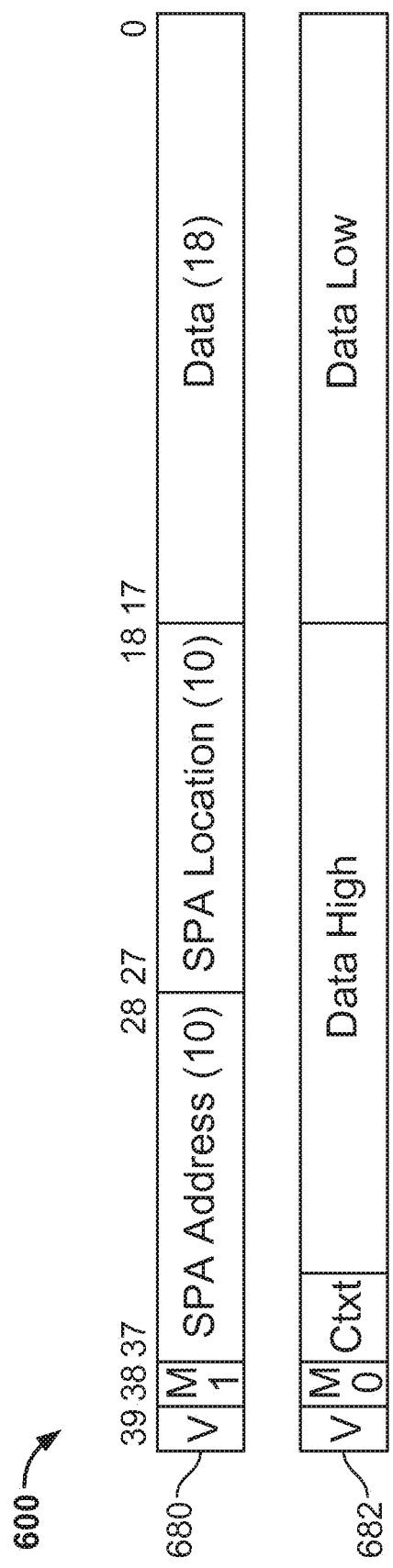
FIG. 6 shows an illustrative data format for a control word and a data word for use in a SPA, in accordance with an implementation.

FIG. 6 shows words 600 that include a control word 680 and a data word 682, according to an illustrative implementation. Control word 680 includes 40 bits, which may include 18 bits of data (at bit locations 0 to 17), 10 bits of address data (at bit locations 18 to 27) that indicate an address within a SPA in which to store the data, 10 bits of address data (at bit locations 28 to 37) that indicate which SPA in which to store the data, one M bit (at bit location 38, and which may be set by the interface between the HPS and the SPA array), and one V bit (at bit location 39). In this example, the 10 bits of address data that indicate which SPA provide support for 1024 SPAs, and the 10 bits of address data that indicate an address within a SPA provide support for 1024 different locations within a SPA. The V bit may correspond to a valid bit as described in relation to FIG. 1 and may be used as a write enable for the destination block.

As is shown in FIG. 6, the M bit may be indicative of a regular data transfer (e.g., M is zero for a regular data transfer) or a control write (e.g., M is one for a control write). This use of the M bit allows for both user data and control data to pass over the same wires, thereby reducing the total amount of wire needed. This may be generally desirable to reduce the cost of the system. For example, it may be desirable to devote most of the wiring in the system to pass data words, so as to minimize the amount of control overhead. In particular, wide address buses may not be used, or their use may be reduced, and existing hardware in a SPA may be used to generate the memory write addresses as needed.

As an example, the 18 bits of data in control word 680 may be written to the SPA array to initialize the routing paths (such as the routing circuitry in the mode selector 362, for example), the instruction code for each SPA (stored in the IMEM 340, for example), and any Control and Status Registers (CSR) used.

Data word 682 includes 40 bits, which may include 18 bits of data low (data of low significance at bit locations 0 to 17), 18 bits of data high (data of high significance at bit locations 18 to 35), two context bits (at bit locations 36 and 37), one M bit (at bit location 38), and one V bit (at bit location 39). The two context bits are used to ensure that data changes at the proper time. For example, the two context bits may be "00" when the incoming data is not new (e.g., the HPS is indicating that the filter coefficients are not updated), and the two context bits may be "11" when the incoming data is new (e.g., the HPS is indicating that the filter coefficients are updated). In one example, each memory may include a bank register (not shown) that stores filter coefficients. The two context bits may be used to swap between the memory banks with precise timing. In this manner, this implementation allows for the sets of coefficients to be switched between channels, or switched over time for the same channel.

As shown in FIG. 6, each of the control word 680 and the data word 682 is 40 bits long, and the context bits are included in the data word 682 but not in the control word 680. In general, it will be understood that any suitable length may be used for the control word and the data word, and the length of the address bits (for either the designation of which SPA or the designation of an address within a SPA) may be adjusted accordingly.

Figure 7:
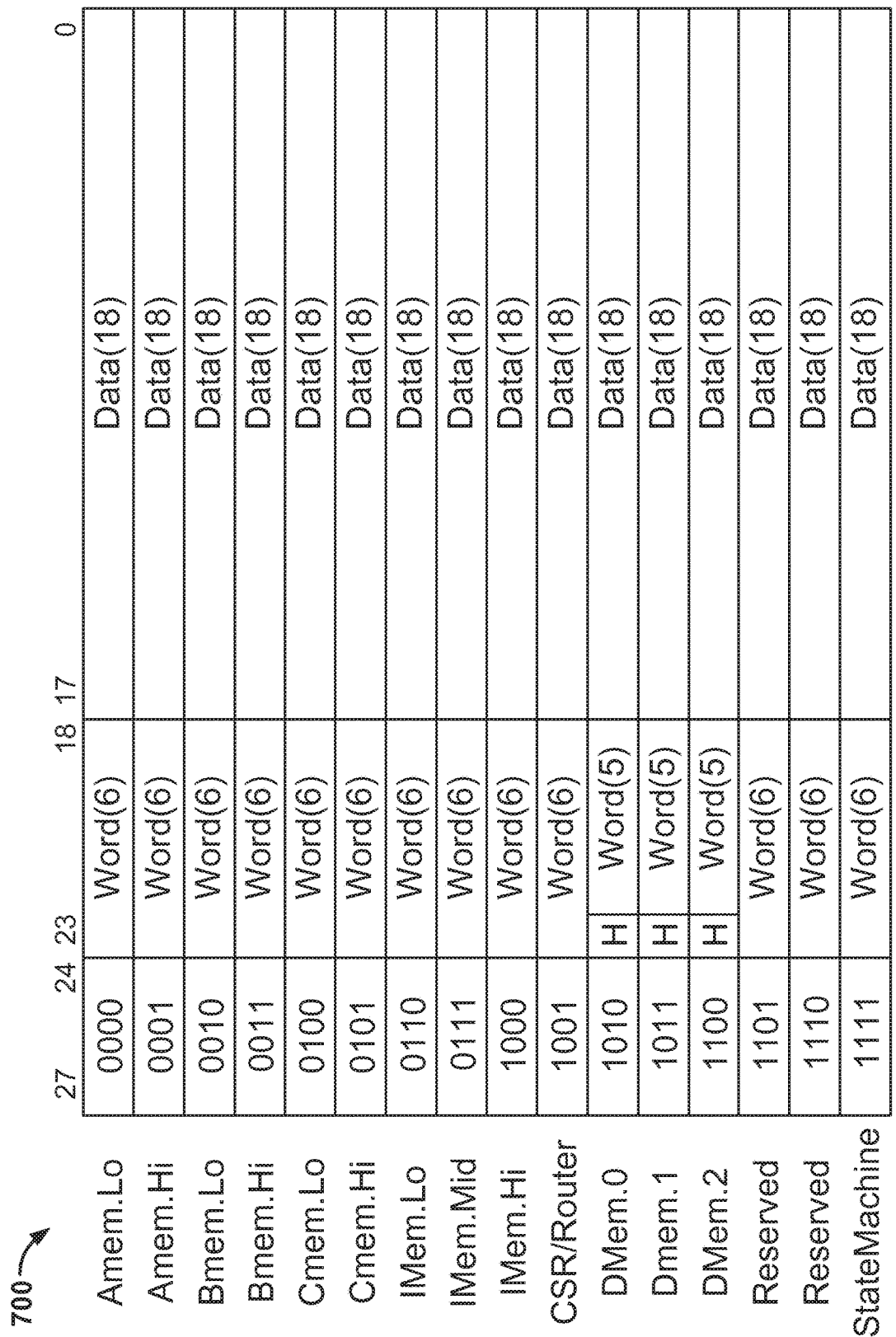
FIG. 7 shows an illustrative diagram of an address mapping for a SPA, in accordance with an implementation.

FIG. 7 depicts a table 700 of portions of example control words for various components of a particular SPA. Each row of the table shown in FIG. 7 corresponds to a particular structure within a SPA. For example, Amem.Lo and Amem.Hi correspond to address mappings for the Amem memory unit block within a SPA. In particular, the data bits (at locations 0 to 17) correspond to the configuration data that is loaded into the SPA at the specified component. The example control words shown in FIG. 7 may be configured by the HPS system, such as the HPS 104 in FIG. 1. The HPS 104 may configure at least these aspects of the SPA array at any time during operation, but may be most often configured at startup time.

FIG. 8 depicts a mapping 800 of an instruction set architecture (ISA) as a 54-bit word. As is shown in FIG. 8, the 54-bit word is encoded as three 18-bit words. The fields within the 54-bit word are described below.

OpCode (6 bits): Encodes the basic DSP operation to be performed for each instruction.
D (1 bit): Determines whether to add in the DMem read word into the accumulator
DOut (2 bits): Determines what to write out of the D Output port
I (1 bit): Determines whether to add in the Accumulator Chain input (Din) into the accumulator.
Bout (2 bits): Determines what to write out of the B Output port.
AOut (2 bits) Determines what to write out of the B Output port.
W (1 bit) Determines whether to write into the DMem.
B (1 bit) Determines whether B mem is written to from the output of AMem or from the input port Bin.
ARinc (6 bits): Increment AMem read Address Register by this amount.
BRinc (6 bits): Increment Bmem read Address Register by this amount.
CRinc (6 bits): Increment CMem read Address Register by this amount.
DRinc (5 bits): Increment DMem read Address Register by this amount.
Next_0 (5 bits) Next Instruction to execute
Next_1 (5 bits) Alternative Next Instruction to execute (controlled by a condition)
Wt (1 bit): Wait for data. The exact data being waited on has been set up by earlier Control register writes.
Repeat (4 bits): How many times to repeat this instruction. This allows for an inner loop to be implemented cheaply.

While most of the information is encoded in cycle-by-cycle instruction data as shown in the example ISA shown in FIG. 8, some information remains fixed from instruction to instruction. There may be no need to include such fixed information in the instruction word in FIG. 8, and the fixed information may be instead encoded as memory mapped control registers. In particular, control and status registers (CSR) may be used to store this fixed information. Examples of information stored in CSR include any of the following.

csrNSHIFT (W 4 bits): Number of bits to right-shift the accumulator when rounding for 18 bit output.
csrRunning (W 1 bits): Global enable for SPA (enables the SPA to run).
csrMaster (W 1 bit): Is the SPA in Master mode? (generates enable signal for the SPA).
csrTriggerMask (W 2 bits): Which inputs (e.g., A, B) will trigger a SPA to begin processing, where the SPA has been waiting until data arrives?
csrThresholdA (W 6 bits): Sets a threshold for AMem.
csrThresholdB (W 6 bits): Sets a threshold for BMem.
csrEnableDelay (W 5 bits): Enable-in to enable-out delay
csrDPassThrough (W 1 bit): Configure chain-in to chain-out to always pass on data independent of microcode.
csrOverflow (RW 1 bit): Has there been an overflow during saturation?
csrDoSat (W 1 bit): Enable saturation detect and clipping.

All of the example CSR information above may be writable. In addition, "csrOverflow" may be a readable status register, that allows a user to detect where saturation has occurred. While most of the example CSR information shown above may be set up once at configuration time, a user may modify any of this information at any time.

Figure 9:
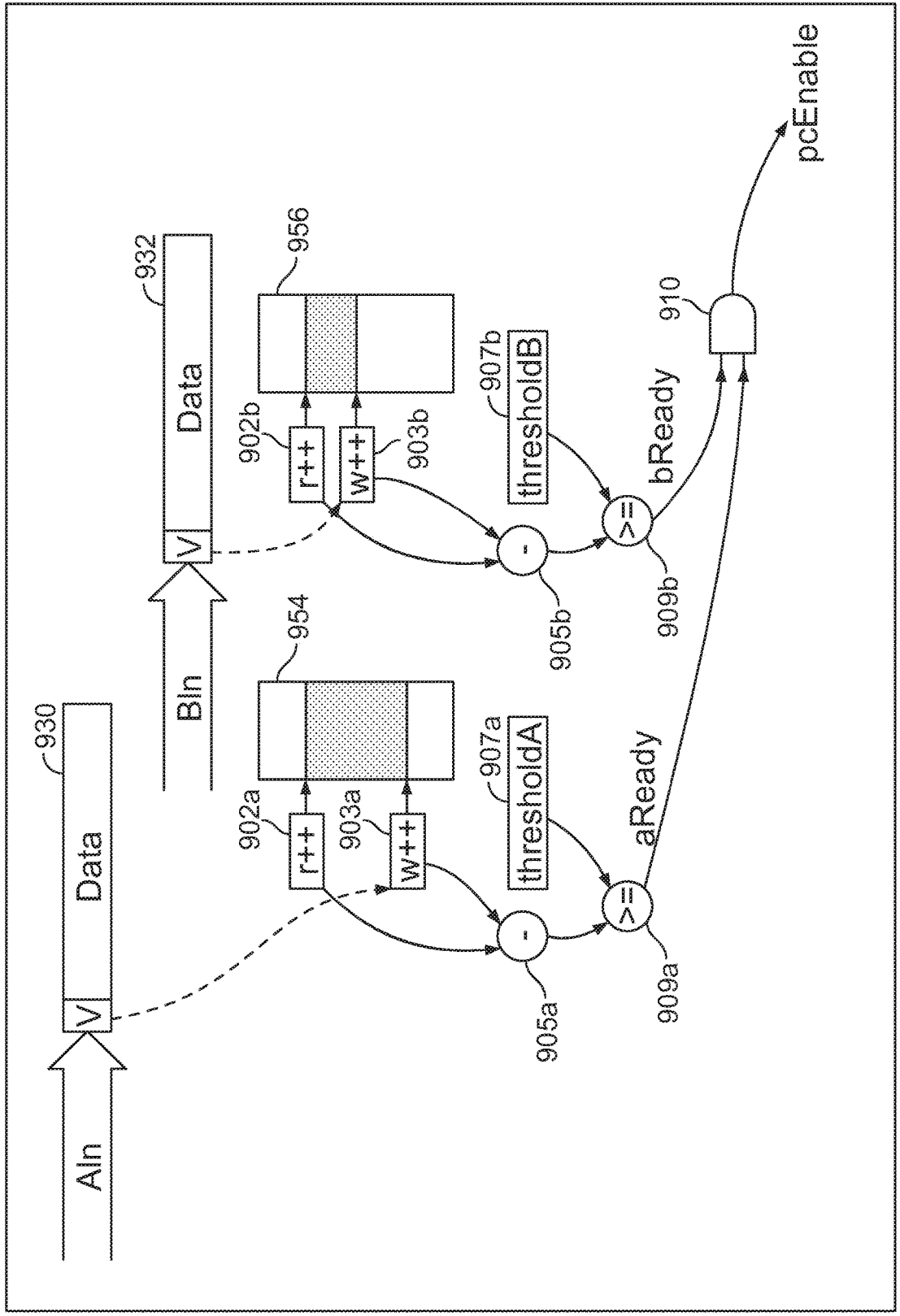
FIG. 9 shows an illustrative block diagram of an enable block of a SPA, in accordance with an implementation.

FIG. 9 depicts a block diagram of an enable block 944, according to an illustrative implementation. To avoid stalls in data processing, hardware support may be provided to allow each SPA to wait for input. It may be desirable to use an enable generator to keep track of write valid signals and disable the program counter until a suitable amount of data has been received. The enable generator may include two counters and two comparators to determine whether the amount of data received is greater than a specified threshold. FIG. 9 shows a schematic diagram of how a SPA may use the A memory and B memory to implement FIFO buffers. The fullness levels of those FIFO buffers may determine whether to enable the SPA.

In the enable block 944, the A input data 930 (including data bits and a valid bit V) is written into a memory unit 954, which is used as a FIFO buffer. The memory unit 954 includes a read marker r++ (902a) and a write marker w++ (903a). The read marker 902a corresponds to the read address of the FIFO and may be stored in a single read address register. Similarly, the write marker 903a corresponds to the write address of the FIFO and may be stored in a single write address register. The data region of the memory unit 954 between the read marker 902a and the write marker 903a may correspond to valid, unprocessed data. The height of this data region is computed by the subtractor 905a, which subtracts the addresses of the read marker 902a from the write marker 903a (or vice versa). At a comparator 909a, this height is compared to a threshold 907a that may be set by csrThresholdA described above. If the height is greater than or equal to the threshold 907a, then the aReady signal is activated to indicate that the memory unit 954 is ready to proceed.

The same elements are also shown for the B input data 932, the memory unit 956, the read marker 902b, the write marker 903b, the subtractor 905b, the threshold 907b that may be set by csrThresholdB described above, and the comparator 909b. The two ready signals aReady and bReady are provided to an AND gate 910, which outputs a pcEnable signal that enables the present SPA to process data as long as both aReady and bReady signals indicate the memory units 954 and 956 are ready to proceed.

As the write marker 903a (or 903b) approaches the read marker 902a (or 902b), then a stall signal may be generated and sent to SPAs that are upstream to the present SPA. In response to the stall signal, the upstream SPAS may stall themselves and stop generating new data. By implementing an enable block in this way, SPAs may be synchronized in a filter lineup, in which downstream blocks are enabled only when data finally reaches them. In this manner, forward pressure may be used to control the system's throughput. This forward-pressure implementation may be particularly useful during debugging operations, or other applications that require robust system operation. Moreover, the enable block 944 of FIG. 9 facilitates forward flow control, which may be particularly useful when the exact data schedule may not be determined statically, such as when filters are used at varying rates in multi-modal systems.

Even when the enable block 944 indicates that the processing within the SPA should be stalled, this does not stall the reading of data from the input port Ain into the memory unit designated for the input port Ain (e.g., memory unit 354 or AMem). Similarly, the reading of data from the input port Bin into the memory unit 356 (or BMem) and the reading of data from the input port Cin into the memory unit 358 (or CMem) should not be stalled while the rest of the SPA is stalled. Because the SPA should still have the capability of receiving and writing data to the various memory units, the SPA's addressing logic should also not be stalled. To implement this, the write address registers of a SPA may be controlled by the valid signal (the V bit) on the input bus, not by the SPA's microcode.

In some implementations, a back-pressure mechanism is also used to stall a current SPA when it is determined that downstream SPAs or blocks are full or busy. In this case, it is undesirable for the current SPA to send new data to those downstream SPAs, so the current SPA is stalled until the downstream SPAs are available to receive and process the new data.

Figure 10:
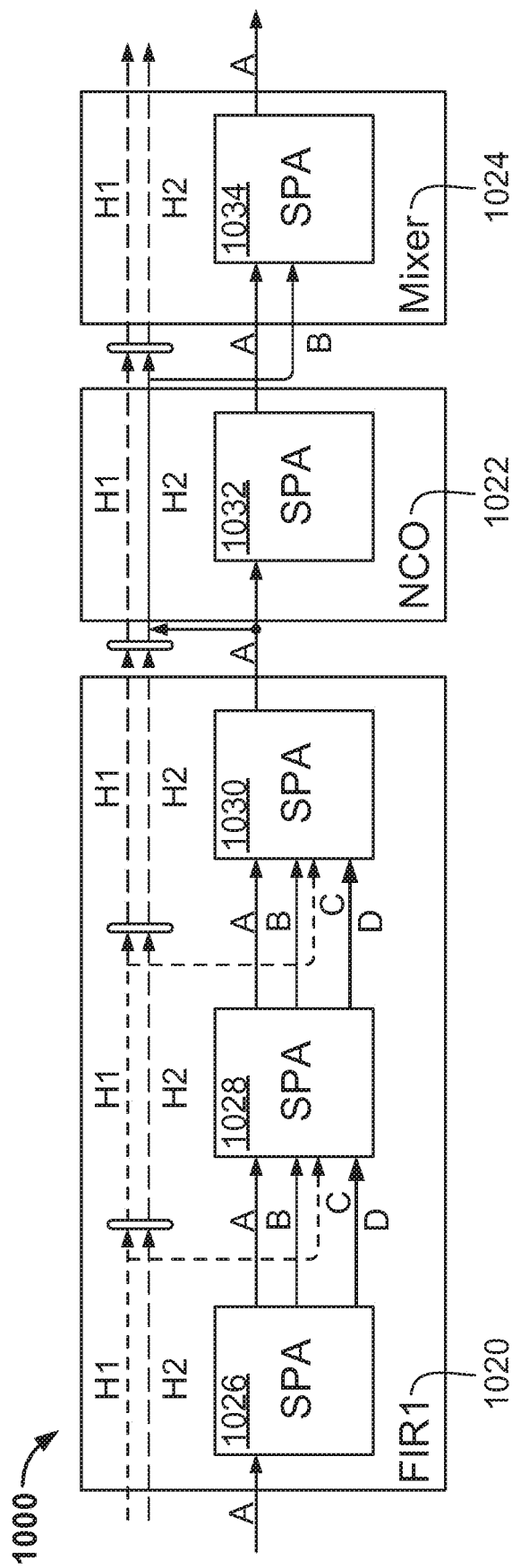
FIG. 10 shows an illustrative block diagram of five SPAS implementing various functions, in accordance with an implementation.

FIG. 10 depicts a block diagram 1000 of a set of five SPAs operating together to perform a desired function, according to an illustrative implementation. Many functions (e.g., large FIRS) may involve multiple SPAs that operate together in unison to perform the desired function. As is shown in FIG. 10, a FIR1 block 1020, an NCO block 1022, and a mixer block 1024 are connected to one another to form a subsystem. The global routing network (e.g., connections H1 and H2) may be used to skip the NCO block 1022, such that data converges at the mixer block 1024. These routing hops may be delayed, such that the mixer block 1024 may wait for valid data before becoming enabled.

Three SPAs 1026, 1028, and 1030 are included in the FIR1 block 1020, one SPA 1032 is included in the NCO block 1022, and one SPA 1034 is included in the mixer block 1024. Each of the SPAs in FIG. 10 may be referred to as a master SPA or a slave SPA. In particular, each SPA may have a register (set by the programmer or CAD tools) that determines whether the SPA is a master SPA or a slave SPA.

For example, each of the SPAs 1032 and 1034 may be a master SPA since they are the only SPAs in the NCO 1022 or mixer 1024, respectively. The SPA 1026 may be a master SPA, which enables the first slave SPA 1028, which in turn enables the second slave SPA 1030. In particular, the master SPA 1026 generates an enable signal based on the data input as is described above in relation to FIG. 9. The first slave SPA 1028 is then enabled by a pipeline enable signal generated by the master SPA 1026. Then, the second slave SPA 1030 is enabled by a pipeline enable signal generated from the first slave SPA 1028. In the example shown in FIG. 10, a special enable wire may be connected from the master SPA 1026 to the first slave SPA 1028, and from the first slave SPA 1028 to the second slave SPA 1030 (not shown). By having multiple SPAs become enabled in this pipelined manner, a large function may be implemented in a scalable way and without a need for a global enable signal. Such an implementation may be useful for allowing a variable number of SPAs to implement a large function with minimal or no wasted hardware.

Without the systems and methods of embodiments of the present invention, an alternative scheme may require some up-front design compromises, such as requiring defining a number of global enables and span of those enables. However, as is shown in FIG. 10, multiple SPAs may form part of a large function, a number of SPAs may implement a separate (decoupled) function, or any suitable combination thereof. By allowing SPAs to be combined together to implement a larger function, or to allow SPAs to operate individually, the systems and methods of embodiments of the present invention allow for an array of SPAs to be used in multiple ways flexibly.

Figure 11:
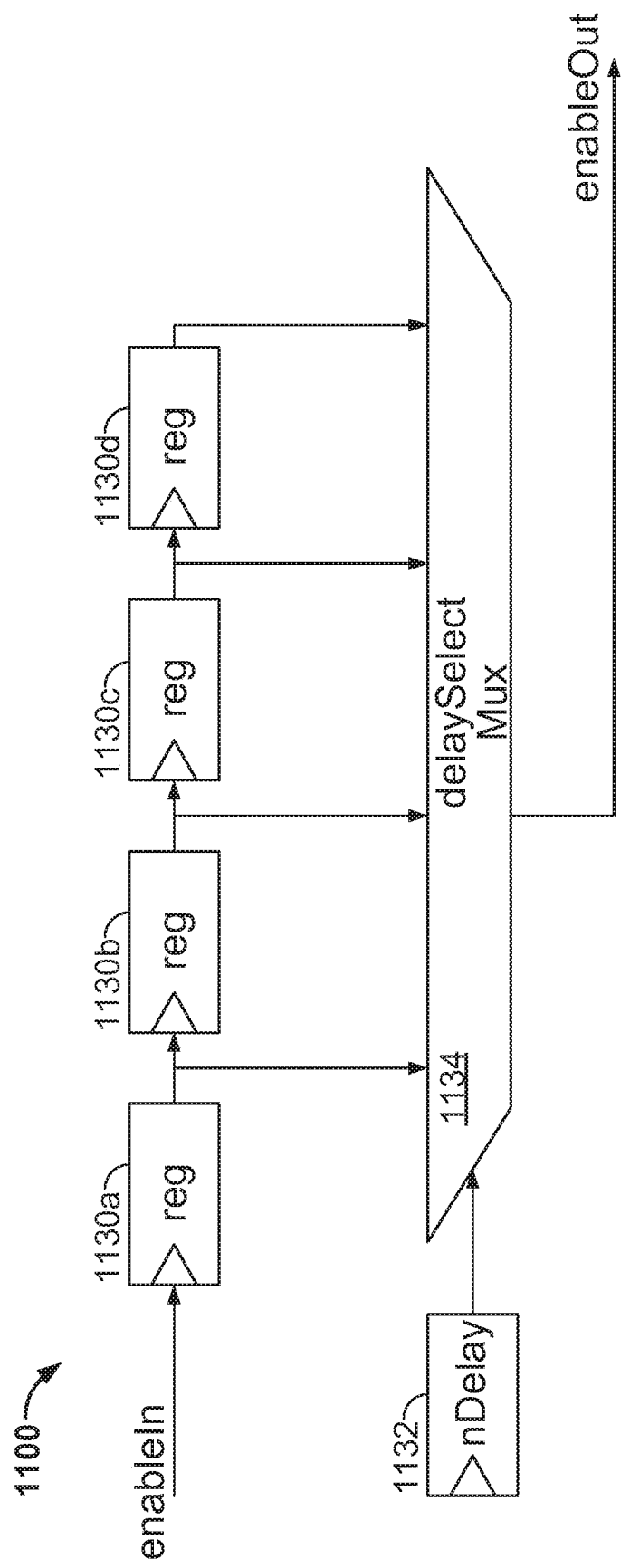
FIG. 11 shows an illustrative block diagram of a delayed enable generator, in accordance with an implementation.

FIG. 11 depicts a block diagram 1100 of a delay block that sets a delay on an internal enable signal, according to an illustrative implementation. The block diagram 1100 includes four registers 1130a-1130d (generally, register 1130), which all provide input to a multiplexer 1134. The selection signal for the multiplexer 1134 is set by the nDelay register 1132.

All SPAs may provide an enable signal to its downstream neighbor, and each SPA may include a programmable register to determine the delay on that enable signal. In particular, the SPA may selectively set a delay between the received enable signal (enableIn) and the outputted enable signal (enableOut). In other words, the SPA may generate an internal enable signal with a delay that is set programmatically via a memory mapped register, such as the register 1132 in block diagram 1100.

In some implementations, a usual setting for the enable delay may be one cycle. This means that a slave SPA may be enabled one cycle later than its predecessor. For a row of SPAs that use an accumulator delay chain (which is itself has a delay of 1 cycle), the SPAs may appear to be a retimed version of a set of SPAs without any enable delay. The row of SPAs may effectively operate like a vector processor with a delay-balanced reducing adder tree, rather than a systolic delay chain. This may be desirable because such an implementation involves a simpler programming model, in which the user may effectively ignore the pipelined enable signals.

In particular, it may be desirable to implement the SPAs in a similar manner as a delay-balanced adder binary tree because such an implementation may be easier to plan since all the inputs to the adder tree are presented in the same cycle. Otherwise, if the tree was unbalanced (or considered as a systolic delay chain), then each input to the adder tree would be presented at different cycles, which may be difficult to plan. However, the delay-balanced adder binary tree adder may be physically difficult to implement since the width of the adder may be unknown ahead of time. In other words, the number of values (and their width) that are being added together may be unknown. To accommodate this uncertainty, different numbers of levels (e.g., $\log_2(N)$ levels) in the adder binary tree may be implemented, but this may be challenging to physically lay out on one chip. Instead, the delay-balanced adder binary tree may be implemented as a chain of adders, whose length may be extended as far as is necessary, and may be set by a programmer at compilation time. A chain of adders may be pipelined (or registered after each adder), such that each successive input may be presented one cycle later for each subsequent adder. Thus, each SPA may be enabled one cycle later than its left hand neighbor, such that each SPA automatically delays its output that feeds into the adder chain. Advantageously, using a chain of SPAs to implement a delay-balanced adder binary tree does not require the programmer to write the program code in a manner to delay each individual output by a set amount.

In some implementations, pipeline delays of more than one may be used in functions where the connection path between SPAs requires more than a delay of one cycle. For example, a unary function (such as sin(x), cos(x), 1/x, or any other suitable function that has a single argument) may be implemented using multiple SPAs.

Figure 12:
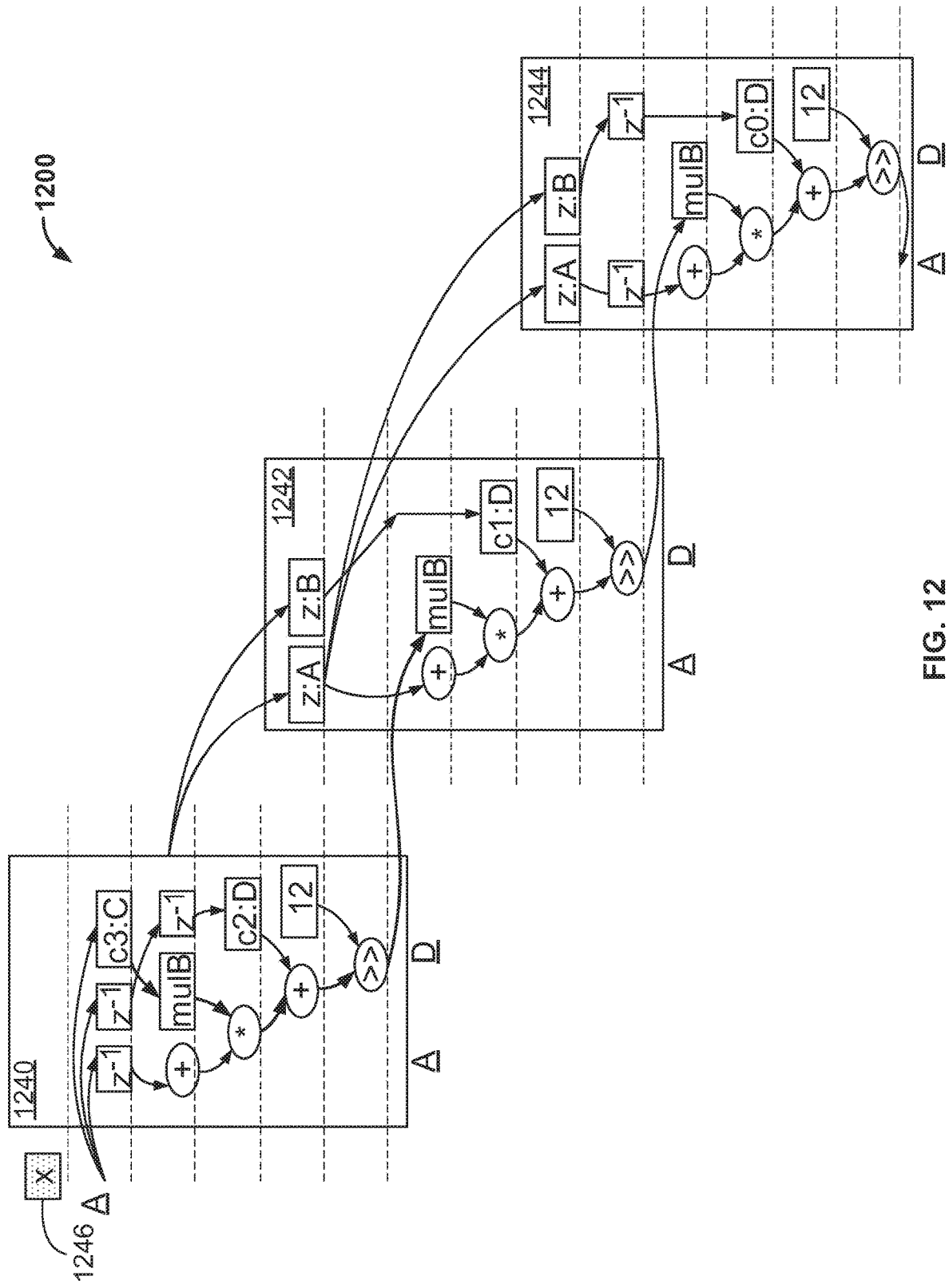
FIG. 12 shows an illustrative block diagram of three SPAs implementing a unary function, in accordance with an implementation.

FIG. 12 depicts a block diagram 1200 of a set of three SPAs implementing a unary function, according to an illustrative implementation. In particular, the three SPAs 1240, 1242, and 1244 form a pipeline and together operate in the Horner/Estrin Polynomial Evaluation Mode described above, or $P_3(x)=C0+x(C1+x(C2+C3x))$, or equivalently, $P_3(x)=(C0+C1*x)+(C2+C3*x) \ x^2$. The horizontal dashed lines in FIG. 12 correspond to clock cycles, where lower dashed lines correspond to later clock cycles.

The "$z^{-1}$" blocks in FIG. 12 denote a delay of one cycle, and the "z:A" and "z:B" blocks denote using the AMem memory unit or the BMem memory unit to implement a delay. In particular, a circular buffer may be used with an incrementing write pointer and an incrementing read pointer operating in lockstep. For example, to implement a delay of N cycles, the read pointer may lag behind the write pointer by N values. As is shown in FIG. 12, the SPA 1240 is a master SPA, and the SPAs 1242 and 1244 are the slaves of the master SPA 1240.

The coefficient C3 is multiplied by the input 1246 ("x") by the mulB multiplier of the first SPA 1240 to obtain the product (C3*x). The product (C3*x) is added to C2 at the second adder in the first SPA 1240. The result (C2+C3*x) is right shifted by 12 bits before being directly provided to the multiplier in the second SPA 1242. The second SPA 1242 multiplies the input x by the result from the first SPA 1240 to obtain x*(C2+C3*x), which is then added with C1 to obtain the sum C1+x*(C2+C3*x). The result is again right shifted by 12 bits before being directly provided to the multiplier in the third SPA 1244. The third SPA 1244 multiplies the input x by the result from the second SPA 1242 to obtain x(C1+x*(C2+C3*x)). Finally, the product is added to C0 and right shifted 12 bits to obtain the polynomial C0+x(C1+x(C2+C3x)). The right shifting may be performed to align the partial results between stages when performing the Horner polynomial evaluation. As is shown in FIG. 12, the various coefficients may be stored in the DMem, or the memory unit 360 of FIG. 3.

As is shown in FIG. 12, a direct hardware connection is fed from the output of an accumulator in the first SPA 1240 to a multiplier in the second SPA 1242. In order to balance the delays, the second SPA 1242 may be enabled four cycles later than the first SPA 1240, as indicated by the first adder in the SPA 1242 being operated four cycles later than the first adder in the SPA 1240. This four-cycle delay may be set at compiler time by setting an enable delay control register to "4" (e.g., by setting the register 1132 nDelay to "4"). In this sense, the second SPA 1242 may enable itself with one delay of four cycles, and pass on a further delayed enable signal (e.g., an external enable signal) to the third SPA 1244. In particular, the first adder in the SPA 1244 is operated four cycles later than the first adder in the SPA 1242 and eight cycles later than the first adder in the SPA 1240.

One advantage of this implementation of flow control is that multiple SPAs may be connected together flexibly, programmatically, and without any additional soft logic implemented in the FPGA. By implementing the entire datapath within the SPAS, external routing to and from the SPA array is reduced or minimized, and the power consumed by the system is reduced or minimized.

By using data memory units as FIFO buffers, the implementations described herein may ensure that multiple streams of data arrive at a computational unit synchronously and can be processed appropriately. While other implementations may require pipeline balancing delays (that are dependent on the routing) to be inserted to achieve the same effect, the use of data memory units as FIFO buffers allows for flexible adjustment based on variable speed of data arrival. For example, data may arrive at a particular SPA on a slow path and a fast path, which may correspond to the input port 330 and the input port 332, respectively. The data on the fast path may be allowed to start filling up in one memory unit (such as the memory unit 356 of FIG. 3, for example) while the SPA awaits for the data on the slow path to be stored into another memory unit (such as the memory unit 354 of FIG. 3, for example). In this manner, the SPA may stall while waiting for the data on the slow path, and when code execution begins in the SPA, both the memory read address pointers for both memory units may still refer to the first data that arrived on each path. In this way, the calculations performed by the SPA are appropriately synchronized. The present disclosure describes a way to effectively use a data memory unit for not only local data storage, but also to be reused as a FIFO buffer for each master SPA. This provides an efficient use of hardware resources and allows an entire datapath to be implemented within the SPAs.

In some implementations, programmable delays may be inserted in a datapath. For example, a SPA may be configured to use the data memory units as delay lines with data being written into a memory unit (such as the memory unit 354, for example), and deliberately read out a number of cycles later to implement a fixed-length delay. In some implementations, two memory units (such as the memory units 354 and 356, for example) may be coupled together to implement double-length delays if desired.

As described herein, a SPA may include a quad-MAC block with a dual accumulator and a pre-adder. An FPGA DSP block may include similar components, and may also have 12 scalar inputs available to use in four multipliers. In contrast, the SPA described herein includes only six scalar inputs (or two scalar inputs for each of the memory units 354, 356, and 358): namely, a.hi, a.lo, b.hi, b.lo, c.hi, and c.lo. As described above, the SPA block may perform two symmetrical scalar multiplications or a complex multiplication. Moreover, having four multipliers in the SPA allows implementation of a symmetrical FIR filter without needing a pre-adder. For example, the four multipliers may be used to compute (a*c)+(b*c) in full, rather than as the factored form (a+b)*c.

In some implementations, the SPA may process data that has different widths from the examples shown in FIGS. 3 and 5. Moreover, the SPA may include different components than the examples of FIGS. 3 and 5. For example, a SPA may receive 18-bit wide data over its input ports, and may include only a single 18×18 b MAC block. As another example, a SPA may receive 18-bit wide data over its input ports, and may include two 18×18 b multipliers in a single MAC block. As another example, a SPA may receive 18-bit wide data over its input ports, and may include two 18×18 b MAC blocks. As another example, a SPA may receive 36-bit wide data over its input ports, and may include two 18×18 b MAC blocks. As another example, a SPA may receive 36-bit wide data over its input ports, and may include four 18×18 b multipliers in two MAC blocks. When the data width corresponds to the processing power of the SPA (e.g., when the SPA receives 18-bit wide data and includes one 18×18 b MAC block, or when the SPA receives 36-bit wide data and includes four 18×18 b multipliers in two MAC blocks), there may be balanced computational power to bandwidth. However, sometimes, the rate of data input is slower than the computation speed. In this case, a small SPA having a single multiplier or a larger SPA including four multipliers may be used. One benefit of having four multipliers is that there is an opportunity to implement a 36×36 b MAC block, which may be desirable in some circumstances. Also, having four multipliers in a single unit allows the building of unary function (such as sine, cosine, and square root, for example) blocks in a contained manner that may provide opportunity to hide data communications from the global network, such as is illustrated in FIG. 12, for example.

Figure 13:
FIG. 13 shows an illustrative flow diagram of a process for configuring circuitry including an array of SPAs and an array of network nodes, in accordance with an implementation.

FIG. 13 shows an illustrative flow diagram of a process 1300 for configuring circuitry for use with an FPGA. In particular, FIG. 13 illustrates the process of configuring an integrated circuit that includes an array of SPAs that is separate from an FPGA and an array of network nodes.

At 1302, the array of SPAS is configured to receive input signals from the FPGA. As described herein (and is shown by FIGS. 3 and 5, a SPA in the array of SPAs may include multiple input ports (e.g., input ports 330, 332, 334, and 336, for example), multiple data memory units (e.g., memory units 354, 356, and 358, for example), signal processing circuitry (e.g., two MAC blocks 364 and 366, for example), and an enable block (e.g., enable generator block 344, for example). As described in relation to FIG. 9, the enable block may include at least two counters, wherein each counter determines an amount of unprocessed data that is stored in a respective one of the data memory units. Moreover, the enable block may be configured to disable the signal processing circuitry until a predetermined amount of data is received over the input ports.

In some implementations, each counter determines the amount of unprocessed data by computing a difference between a read marker address and a write marker address within the respective one of the plurality of data memory units. The enable block may determine that the predetermined amount of data is received over the input ports when each of the at least two counters exceeds a respective threshold. In some implementations, each data memory unit corresponds to an input port in the plurality of input ports, and at least one of the data memory units is implemented as a FIFO buffer. The fullness levels of those FIFO buffers may determine whether to enable the SPA.

In some implementations, the signal processing circuitry includes two multiply-and-accumulate blocks, each multiply-and-accumulate block comprising a pre-adder, two multipliers, and an accumulator. Moreover, the SPA may further comprises routing circuitry (e.g., mode selector 362, for example) defining a selected mode of operation, which may be selected from a group of modes comprising symmetric scalar multiplication mode, single scalar multiplication mode, complex multiplication mode, mixer mode, superscalar filter mode, oscillator angle mode, and polynomial evaluation mode.

In some implementations, the SPA further includes an instruction memory unit (e.g., the IMEM 340, for example) configured to store microcode for the SPA. The microcode may include instructions that vary cycle-to-cycle, and instructions that are fixed cycle-to-cycle may be stored in memory mapped control registers such as CSRs. For example, the instructions that are fixed may indicate whether the SPA is a master SPA or a slave SPA. As another example, the instructions that are fixed may include a value for at least one threshold parameter for use by the enable block to compare with at least one of the counters. As is described in relation to FIG. 9, this threshold may be compared with the difference between the read marker address and the write marker address, to determine whether a predetermined amount of data is received over the input ports.

At 1304, the array of network nodes is configured to controllably route the input signals to the array of SPAs. For example, the input signals may include a data word and a control word that are transmitted over a same wire between at least one of the network nodes and at least one of the SPAs. As is described in relation to FIG. 6, the data word and the control word may each include a mode bit indicative of whether the input signal corresponds to a transfer of data or a control write. Moreover, the data word and the control word may each include a valid bit representative of a write enable signal for at least one of the SPAs in the array of SPAS. As shown in FIG. 6, the control word (and/or the data word) may include at least one context bit indicative of whether to update a first set of coefficients with a second set of coefficients. In an example, the context bits may be used for determining which coefficient bank is to be used with the data when there are multiple bank filters, such as in DPD. In this manner, the context bits allow for a controlled and mathematically correct transition from one set of coefficients to another set of coefficients, with no breaks in processing.

In some implementations, each SPA in the array of SPAs has a corresponding input network node in the array of network nodes that provides at least one input to the respective SPA, and each SPA in the array of SPAs has a corresponding output network node in the array of network nodes that receives at least one output from the respective SPA. For example, as is shown in FIG. 1, SPA 111$a$'s corresponding input network node is the network node 113$a$, because the network node 113$a$ provides input to the SPA 111$a$. Moreover, SPA 111$a$'s corresponding output network node is the network node 113$b$, which receives output from the SPA 111$a$. Similarly, the other SPAs shown in FIG. 1 have corresponding input network nodes and output network nodes.

In some implementations, the array of SPAs forms a linear chain of SPAs that includes a set of direct connections between pairs of SPAs in the array of SPAs. For example, as is shown in FIG. 1, even though the SPAs 111 are depicted in a two-dimensional grid, the SPA array may be thought of as a linear chain because the SPAs at the end of one row feed input to a SPA in the next row. In particular, the SPA 111$d$ feeds input to the SPA 111$h$, and the SPA 111$e$ feeds input to the SPA 111$i$.

In some implementations, the array of network nodes forms a two-dimensional grid. Within the two-dimensional grid, a set of horizontal direct connections connect pairs of adjacent network nodes that share a row in the two-dimensional grid, and a set of vertical direct connections connect pairs of adjacent network nodes that share a column in the two-dimensional grid. For example, as is shown in FIG. 1, the network nodes 113 forms a two-dimensional rectangle, and the horizontal connections H1 and H2 form direct connections between neighboring network nodes in the same row. Similarly, the vertical connections V1 and V2 form direct connections between neighboring network nodes in the same column.

In some implementations, the circuitry comprises a hard processor subsystem that provides programming instructions to the array of SPAS, and an array of direct memory access blocks that interfaces between the hard processor subsystem and the array of SPAs. For example, as is shown in FIG. 1, the HPS 104 communicates with the array of SPAs 111 via the DMA blocks 115.

In some implementations, at least a first SPA and a second SPA in the array of SPAs are connected such that an output signal of the first SPA is directly transmitted to an operator within the second SPA, and the first SPA and the second SPA implement a unary function. For example, as is shown in FIG. 12, the three SPAs 1240, 1242, and 1244 implement a unary function by forming a pipeline and operating in a Horner/Estrin Polynomial Evaluation Mode described above. Specifically, the three SPAS in FIG. 12 compute $P_3(x)=C0+x(C1+x(C2+C3x))$, or equivalently, $P_3(x).(C0+C1*x)+(C2+C3*x) x^2$.

In some implementations, some of the SPAS in the array of SPAs are master SPAs, and some of the SPAS in the array of SPAS are slave SPAS. For example, as is shown in FIG. 10, the master SPA 1026 generates a pipeline enable signal, which enables the first slave SPA 1028. Then, the second slave SPA 1030 is enabled by a pipeline enable signal generated from the first slave SPA 1028. In the example shown in FIG. 10, a special enable wire may be connected from the master SPA 1026 to the first slave SPA 1028, and from the first slave SPA 1028 to the second slave SPA 1030 (not shown). By having multiple SPAS become enabled in this pipelined manner, a large function may be implemented in a scalable way and without a need for a global enable signal. Such an implementation may be useful for allowing a variable number of SPAs to implement a large function with minimal or no wasted hardware. As is clearly shown in FIG. 10, the SPA 1028 is a slave SPA relative to the SPA 1026, but is a master SPA relative to the SPA 1030. In this way, the list of master SPAs and the list of slave SPAs does not have to be mutually exclusive.

The above use of the term "FPGA" is exemplary, and should be taken to include various types of integrated circuits, including but not limited to commercial FPGA devices, complex programmable logic device (CPLD) devices, configurable application-specific integrated circuit (ASSP) devices, configurable digital signal processing (DSP) and graphics processing unit (GPU) devices, hybrid application-specific integrated circuit (ASIC), programmable devices or devices which are described as ASICs with programmable logic cores or programmable logic devices with embedded ASIC or ASSP cores.

It will be apparent to one of ordinary skill in the art, based on the disclosure and teachings herein, that aspects of the disclosed techniques, as described above, may be implemented in many different forms of software, firmware, and hardware in the implementations illustrated in the figures. The actual software code or specialized hardware used to implement aspects consistent with the principles of the disclosed techniques are not limiting. Thus, the operation and behavior of the aspects of the disclosed techniques were described without reference to the specific software code—it being understood that one of ordinary skill in the art would be able to design software and hardware to implement the aspects based on the description herein.

What is claimed is:

1. An integrated circuit system, comprising:
   programmable logic circuitry in a first region of the integrated circuit system;
   an array of instruction set architecture (ISA)-based signal processors in a second region of the integrated circuit different from the first region, wherein the array of ISA-based signal processors is programmable to perform at least a filtering function; and
   an interconnect network that enables communication between ISA-based signal processors of the array of ISA-based signal processors.

2. The integrated circuit system of claim 1, wherein the programmable logic circuitry comprises field programmable gate array (FPGA) circuitry configured to send data to or receive data from the array of ISA-based signal processors.

3. The integrated circuit system of claim 1, wherein the array of ISA-based signal processors has vector processing functionality.

4. The integrated circuit system of claim 1, wherein the filtering function comprises digital pre-distortion (DPD) processing.

5. The integrated circuit system of claim 1, wherein the array of ISA-based signal processors comprises distributed memory, wherein each ISA-based signal processor of the array of ISA-based signal processors is associated with at least one memory block of the distributed memory.

6. The integrated circuit system of claim 1, wherein the interconnect network connects a first ISA-based signal processor of the array of ISA-based signal processors to a second ISA-based signal processor of the array of ISA-based signal processors to skip a third ISA-based signal processor located between the first ISA-based signal processor and the second ISA-based signal processor in the array of ISA-based signal processors.

7. The integrated circuit system of claim 6, wherein the array of ISA-based signal processors comprises at least a first row, a second row, and a third row of ISA-based signal processors, and a first column, a second column, and a third column of ISA-based signal processors.

8. The integrated circuit system of claim 1, comprising a hardened processing system that controls and monitors the array of ISA-based signal processors.

9. The integrated circuit system of claim 1, wherein an ISA-based signal processor of the array of ISA-based signal processors comprises an instruction unit, a program counter, or a combination thereof.

10. The integrated circuit system of claim 9, wherein the instruction unit stores microcode for the ISA-based signal processor.

11. The integrated circuit system of claim 9, wherein the program counter controls a sequence of processing steps in the ISA-based signal processor.

12. An integrated circuit system, comprising:
programmable logic circuitry in a first region of the integrated circuit system;
an array of instruction set architecture (ISA)-based signal processors in a second region of the integrated circuit different from the first region; and
an interconnect network that communicatively connects a first ISA-based signal processor of the array of ISA-based signal processors to a second ISA-based signal processor of the array of ISA-based signal processors to skip a third ISA-based signal processor located between the first ISA-based signal processor and the second ISA-based signal processor in the array of ISA-based signal processors.

13. The integrated circuit system of claim 12, wherein the array of ISA-based signal processors comprises at least a first row, a second row, and a third row of ISA-based signal processors, and a first column, a second column, and a third column of ISA-based signal processors.

14. The integrated circuit system of claim 12, wherein the array of ISA-based signal processors is programmable to perform at least a filtering function.

15. The integrated circuit system of claim 14, wherein the filtering function comprises digital pre-distortion (DPD) processing.

16. An integrated circuit system, comprising:
programmable logic circuitry in a first region of the integrated circuit system;
an array of instruction set architecture (ISA)-based signal processors in a second region of the integrated circuit different from the first region, wherein the array of ISA-based signal processors is programmable to perform at least a filtering function; and
a hardened processing system that controls and monitors the array of ISA-based signal processors.

17. The integrated circuit system of claim 16, wherein the hardened processing system controls and monitors the array of ISA-based signal processors by updating contents of and configuring the array of ISA-based signal processors.

18. The integrated circuit system of claim 17, wherein the contents comprise coefficients for the filtering function.

19. The integrated circuit system of claim 16, wherein the filtering function comprises digital pre-distortion (DPD) processing.

20. An integrated circuit system, comprising:
field programmable gate array (FPGA) circuitry in a first region of the integrated circuit system;
an array of instruction set architecture (ISA)-based signal processors in a second region of the integrated circuit different from the first region; and
an interconnect network that communicatively connects a first ISA-based signal processor of the array of ISA-based signal processors directly to stream data to a second ISA-based signal processor of the array of ISA-based signal processors.

21. The integrated circuit system of claim 20, wherein the interconnect network communicatively connects the first ISA-based signal processor directly to the second ISA-based signal processor using unidirectional routing circuitry.

22. The integrated circuit system of claim 20, wherein the first ISA-based signal processor of the array of ISA-based signal processors comprises one or more output ports that stream data to the second ISA-based signal processor of the array of ISA-based signal processors.

23. The integrated circuit system of claim 21, wherein the second ISA-based signal processor of the array of ISA-based signal processors comprises one or more input ports that receive the data from the plurality of output ports.

24. The integrated circuit system of claim 20, wherein the array of ISA-based signal processors is programmable to perform a filtering function.

25. The integrated circuit system of claim 24, wherein the filtering function comprises digital pre-distortion (DPD) processing.

26. A method, comprising:
receiving input data at an array of instruction set architecture (ISA)-based signal processors in a first region of an integrated circuit separate from a second region comprising programmable logic circuitry of the integrated circuit, wherein the array of ISA-based signal processors is programmable to perform at least a filtering function; and
routing communication between at least a portion of the array of ISA-based signal processors via an interconnect network.

27. The method of claim 26, wherein the array of ISA-based signal processors has vector processing functionality.

28. The method of claim 26, wherein routing communication between at least a portion of the array of ISA-based signal processor comprises streaming data from a first ISA-based signal processor of the array of ISA-based signal processors directly to a second ISA-based signal processor of the array of ISA-based signal processors.

29. The method of claim 26, wherein routing communication between at least a portion of the array of ISA-based signal processor comprises connecting a first ISA-based signal processor of the array of ISA-based signal processors to a second ISA-based signal processor of the array of ISA-based signal processors to skip a third ISA-based signal processor located between the first ISA-based signal processor and the second ISA-based signal processor in the array of ISA-based signal processors.

30. The method of claim 26, comprising transmitting instructions, via a hardened processing system, to the array of ISA-based signal processors to perform at least a filtering function.

31. The method of claim 26, comprising, in response to routing communication between at least the portion of the array of ISA-based signal processors, implementing the portion of the array of ISA-based signal processors as a signal processor engine.

32. A method comprising:
  facilitating a first portion of a filtering function using a field-programmable gate array of an integrated circuit device; and
  performing a second portion of a filtering function using an array of instruction set architecture (ISA)-based signal processors of the integrated circuit device, wherein performing the second portion of the filtering function comprises:
    receiving, at the array of ISA-based signal processors, at least one instruction to perform the second portion of the filtering function; and
    generating output data based at least in part on the at least one instruction.

33. The method of claim 32, wherein the filtering function comprises a digital pre-distortion (DPD) filtering function.

34. The method of claim 32, comprising configuring one or more ISA-based signal processors of the array of ISA-based signal processors using a processing system.

35. The method of claim 32, comprising routing interconnections between the array of instruction set architecture (ISA)-based signal processors via an interconnect network of the integrated circuit device.

36. The method of claim 32, wherein facilitating a first portion of the filtering function comprises transmitting input signals from the field-programmable gate array to the ISA-based signal processors.

* * * * *